US009562942B2

(12) United States Patent
Shinohara et al.

(10) Patent No.: US 9,562,942 B2
(45) Date of Patent: Feb. 7, 2017

(54) PROBE APPARATUS

(71) Applicant: Tokyo Electron Limited, Tokyo (JP)

(72) Inventors: Eiichi Shinohara, Nirasaki (JP); Kenji Yamaguchi, Tokyo (JP); Masataka Hatta, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 207 days.

(21) Appl. No.: 14/328,860

(22) Filed: Jul. 11, 2014

(65) Prior Publication Data
US 2015/0015285 A1    Jan. 15, 2015

(30) Foreign Application Priority Data

Jul. 11, 2013 (JP) .................. 2013-145598
Mar. 27, 2014 (JP) .................. 2014-065736

(51) Int. Cl.
| G01R 31/26 | (2014.01) |
| G01R 1/04 | (2006.01) |
| G01R 1/067 | (2006.01) |
| G01R 31/319 | (2006.01) |
| G01R 31/28 | (2006.01) |

(52) U.S. Cl.
CPC ......... *G01R 31/2601* (2013.01); *G01R 1/0491* (2013.01); *G01R 1/067* (2013.01); *G01R 31/2862* (2013.01); *G01R 31/2879* (2013.01); *G01R 31/31905* (2013.01)

(58) Field of Classification Search
CPC .......... G01R 31/26; G01R 1/04; G01R 1/067; G01R 1/073; G01R 31/31905; G01R 31/2879; G01R 31/2862
See application file for complete search history.

(56) References Cited

U.S. PATENT DOCUMENTS 4,990,831 A * 2/1991 Thayer, III ................ H01T 2/00
                                                        313/231.01
6,634,245 B1 * 10/2003 Yoshioka ................ H01L 21/68
                                                        324/750.2

(Continued)

FOREIGN PATENT DOCUMENTS

| AT | 412175 B | 10/2004 |
| JP | 2003-100819 A | 4/2003 |

(Continued)

*Primary Examiner* — Son Le
*Assistant Examiner* — Zannatul Ferdous
(74) *Attorney, Agent, or Firm* — Pearne & Gordon LLP

(57) ABSTRACT

A probe apparatus can suppress a spark from occurring near a wafer surface simply and efficiently when inspecting electrical characteristics of a semiconductor device at wafer level. A spark preventing device 50 mounted in the probe apparatus includes a surrounding member 52 which surrounds probe needles 24G and 24S between a probe card 16 and a mounting table 12; and a gas supply device 54 configured to supply a gas to a vicinity of the probe needles 24G and 24S through an inside or a vicinity of the surrounding member 52 to form an atmosphere of a preset pressure higher than an atmospheric pressure in the vicinity of the probe needles 24G and 24S when inspecting the electrical characteristics of each chip on a semiconductor wafer W. A contact plate 34 also serves as the surrounding member 52.

18 Claims, 17 Drawing Sheets

(56) References Cited

U.S. PATENT DOCUMENTS

| | | | | |
|---|---|---|---|---|
| 2002/0105354 A1* | 8/2002 | Fujimoto | ............. | G01R 1/0735 |
| | | | | 324/754.03 |
| 2007/0169535 A1* | 7/2007 | Itakura | ................. | G01N 27/223 |
| | | | | 73/1.06 |
| 2007/0247177 A1 | 10/2007 | Ruckenbauer | | |
| 2008/0267741 A1* | 10/2008 | Nagasaka | ........... | H01L 21/6838 |
| | | | | 414/217 |
| 2013/0063171 A1* | 3/2013 | Kouno | ............... | G01R 31/2886 |
| | | | | 324/750.25 |
| 2015/0145540 A1* | 5/2015 | Komatsu | ........... | G01R 31/2601 |
| | | | | 324/750.03 |

FOREIGN PATENT DOCUMENTS

| | | | |
|---|---|---|---|
| WO | 2010/021070 A1 | 2/2010 | |
| WO | 2012/122578 A1 | 9/2012 | |

* cited by examiner

PROBE APPARATUS

CROSS-REFERENCE TO RELATED APPLICATION

This application claims the benefit of Japanese Patent Application Nos. 2013-145598 and 2014-065736 filed on Jul. 11, 2013 and Mar. 27, 2014, respectively, the entire disclosures of which are incorporated herein by reference.

TECHNICAL FIELD

The embodiments described herein pertain generally to a probe apparatus of inspecting electrical characteristics of a semiconductor device at wafer level.

BACKGROUND

In a manufacturing process of a semiconductor device, electrical characteristics of the semiconductor device are inspected by a semiconductor testing apparatus at the end of a pre-process or a post-process, so that faults of chips are inspected. In such a semiconductor testing apparatus, a probe apparatus serves as a handling apparatus that interfaces the chips on the semiconductor wafer, and a tester in charge of signal processing when performing an inspection at wafer state or at wafer level. Typically, the probe apparatus includes a movable mounting table (chuck top) configured to mount and support thereon the semiconductor wafer; a probe card having probe needles to be brought into contact with electrodes of each chip, thus allowing the chips to be electrically connected with the tester; and a moving device configured to move the mounting table to align the inspection target chips with respect to the probe needles or to the probe card fixed at a certain position.

A voltage (a breakdown voltage or a rated voltage) treated in a semiconductor device for power supply, i.e., a so-called power device, such as a power MOSFET or IGBT may be greatly differed depending on the purposes of use. For example, the power device may treat a voltage ranging from about 100 V to about 200 V in electronic home appliances, whereas the power device may treat a very high voltage ranging from about 600 V to about 1000 V in cars or industrial appliances. In railroad vehicles or power transmission and distribution systems, the power device may treat several thousands of voltages or higher.

Accordingly, when conducting inspection of electrical characteristics of a power device at wafer level in the semiconductor testing device, a voltage suitable for the power device may be applied from the tester to terminals on individual inspection target chips (power devices) on a wafer via the probe needles. If, however, the voltage applied for inspecting the chips is high, a spark (electric discharge) may be generated in the vicinity of a surface of the wafer, so that adjacent chips (power devices) may be damaged. This problem is more conspicuous in a SiC power device than in a Si power device.

Recently, a SiC power device is attracting attention as a next-generation power device having a compact size, a high breakdown voltage and a low loss. Since, however, a chip of the SiC power device is small-sized, a gap between electrodes on the chip is narrow, and a spark may be easily generated between a probe needle that applies a high voltage and a probe needle that applies a low voltage, or between a high-voltage probe needle and an electrode on an adjacent chip. Further, since it is difficult to forma protection circuit within the small-sized chip, the chip is weak for the spark.

To solve this problem, there is known a breakdown voltage inspecting apparatus (see, for example, Patent Documents 1 and 2). In this technique, an entire surface of a semiconductor wafer is covered with a liquid having higher insulation property than the atmosphere, or a surface of a inspection target chip is locally covered with such an insulating liquid on the wafer. Then, a breakdown voltage test is conducted by bringing a probe needle into contact with an electrode of the inspection target chip covered with the insulating liquid.

In such a breakdown voltage inspecting apparatus, since a leading end of the probe needle comes into contact with the electrode of the inspection target chip in the insulating liquid, a spark may not be generated from the probe needle, so that the inspection can be safely conducted even in a test in which a high voltage equal to or higher than several thousands of voltages is applied.

Patent Document 1: Japanese Patent Laid-open Publication No. 2003-100819

Patent Document 2: International Publication No. WO2010/021070

However, if the configuration of covering the entire surface of the semiconductor wafer with the insulating liquid (Patent Document 1) and the configuration of locally covering only the surface of the inspection target chip on the wafer (Patent Document 2) are adopted to an actual breakdown inspecting apparatus or a probe apparatus, a device or a control device for handling the insulating liquid on the wafer may be complicated, though the degree of complication may be differed therebetween. Further, an inspection time may also be lengthened.

SUMMARY

In view of the foregoing problems, example embodiments provide a probe apparatus capable of suppressing a spark (electric discharge) from occurring near a wafer surface simply and efficiently when inspecting electrical characteristics of a semiconductor device at wafer level.

In one example embodiment, a probe apparatus of inspecting an electrical characteristic of a semiconductor device formed on a semiconductor wafer includes a movable mounting table configured to mount and support the semiconductor wafer thereon; a probe card this is provided above the mounting table to face the mounting table, and is configured to support a probe needle having a leading end to be come into contact with an electrode on the semiconductor wafer supported on the mounting table; a surrounding member that is provided between the probe card and the mounting table and configured to surround a vicinity of the probe needle; and a gas supply device configured to supply a gas to the vicinity of the probe needle through an inside or a vicinity of the surrounding member in order to form an atmosphere of a pressure higher than an atmospheric pressure in the vicinity of the probe needle when inspecting the electrical characteristic of the semiconductor device.

In the present example embodiment, it may be possible to suppress a spark from occurring on the surface of the semiconductor wafer based on Paschen's law by forming the atmosphere of the pressure higher than the atmospheric pressure in the vicinity of the probe needles when inspecting the electrical characteristics of the semiconductor device on the semiconductor wafer. Further, since the gas atmosphere is formed on the semiconductor wafer in order to suppress a spark, the configuration and the control thereof may be simple, without increasing the inspection time.

In another example embodiment, a probe apparatus of inspecting an electrical characteristic of a power device that is formed on a semiconductor wafer and has electrodes on a front and rear surfaces thereof includes a movable mounting table configured to mount and support the semiconductor wafer thereon; a probe card that is provided above the mounting table to face the mounting table, and is configured to support a probe needle having a leading end to be come into contact with the electrode on the front surface of the power device, the electrode on the front surface of the power device being exposed at a front surface of the semiconductor wafer supported on the mounting table; a first connection conductor configured to connect the probe needle and a corresponding first terminal of a tester; a mounting surface conductor that serves as a mounting surface of the mounting table and is configured to be in contact with the electrode on the rear surface of the power device, the electrode on the rear surface of the power device being exposed at a rear surface of the semiconductor wafer supported on the mounting table; a contactor that is provided at the mounting table and is configured to be vertically moved and electrically connected with the mounting surface conductor; a contact plate, having a conductivity, provided between the mounting table and the probe card to come into contact with the contactor at a bottom surface thereof and configured to surround the probe needle; a second connection conductor configured to connect the contact plate and a corresponding second terminal of the tester; and a gas supply device configured to supply a gas to a vicinity of the probe needle through an inside or a vicinity of the contact plate in order to form an atmosphere of a pressure higher than an atmospheric pressure in the vicinity of the probe needle when inspecting the electrical characteristic of the power device.

In the present example embodiment, the same effects are achieved as the above example embodiment. Further, the contact plate is disposed between the mounting table and the probe card to achieve the electric conduction between the tester and the electrode on the rear surface of the power device of which electrical characteristics is inspected on the semiconductor wafer, and the contact plate also serves as the surrounding member which forms the surrounding space. Thus, it is possible to improve simplicity and efficiency of the spark preventing device.

In accordance with the probe apparatus of the example embodiments, by using the aforementioned configurations and operations, it may be possible to suppress the spark (electric discharge) from occurring near the surface of the wafer simply and efficiently when inspecting the electrical characteristics of the semiconductor device at wafer level.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
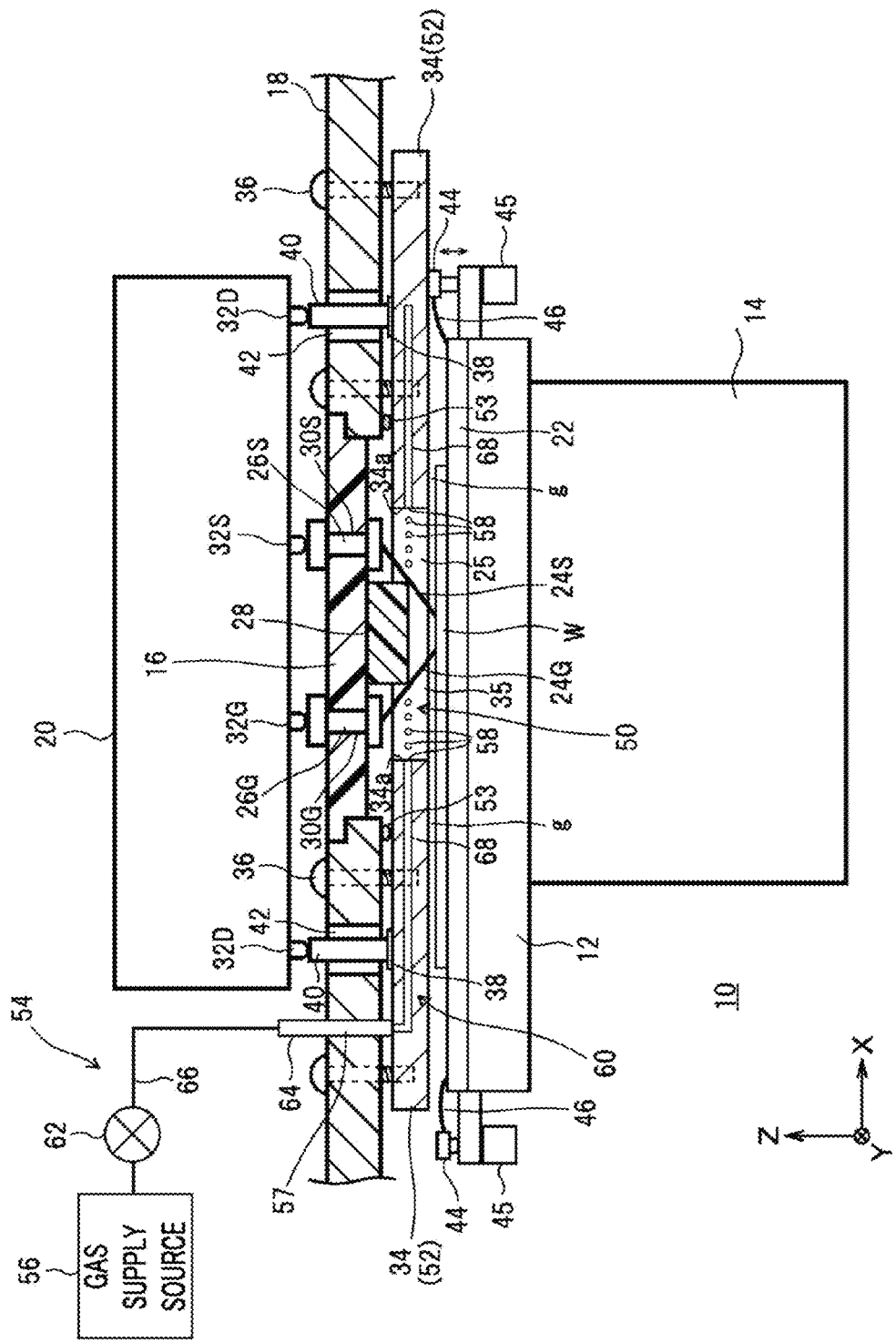
FIG. 1 is partially cross sectional front view illustrating a configuration of a probe apparatus in accordance with a first example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

(Overall Configuration and Operation of Probe Apparatus)

Figure 2:
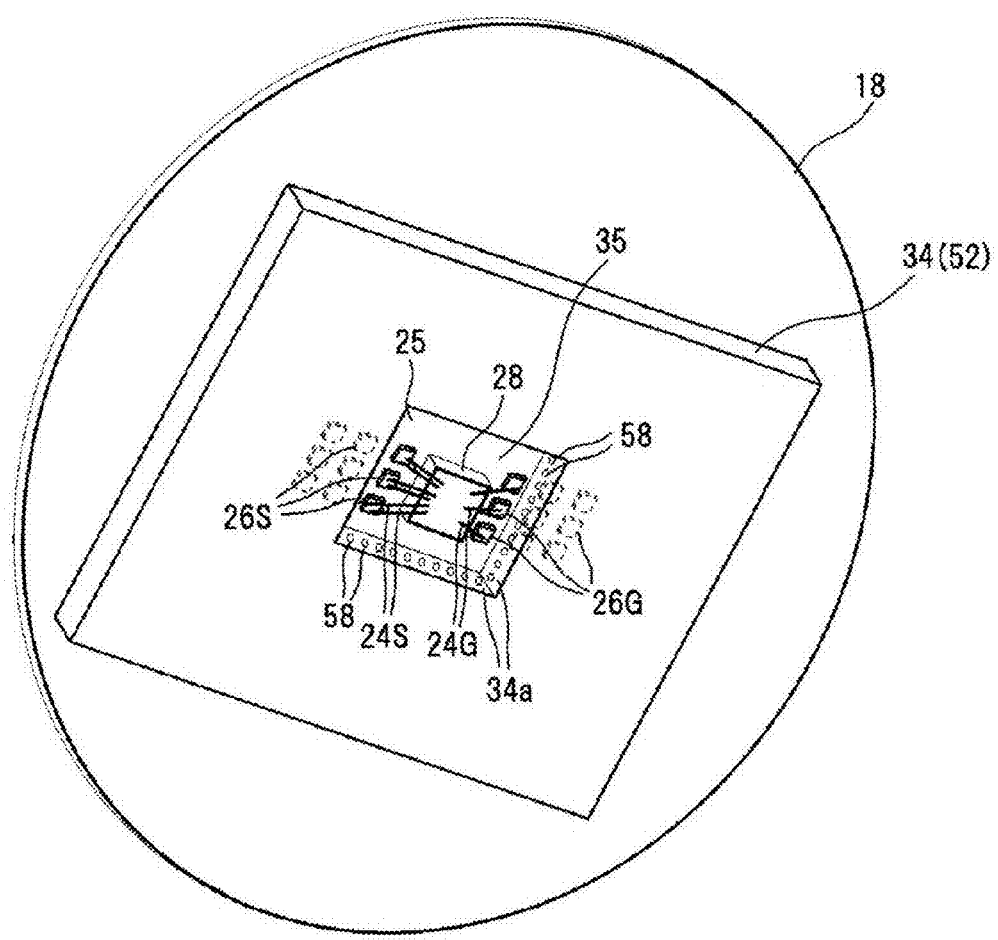
FIG. 2 is a perspective view of major components of the probe apparatus seen from obliquely below.

FIG. 1 illustrates a configuration of a probe apparatus in accordance with a first example embodiment, and FIG. 2 illustrates a configuration of major components of the probe apparatus seen from obliquely below.

This probe apparatus is configured to inspect a semiconductor wafer W on which a pre-process of a semiconductor process has been performed. Specifically, the probe apparatus is configured to inspect electrical characteristics (dynamic characteristics, static characteristics) of respective chips at wafer level on a multiple number of power devices (e.g., power MOSFETs) that are formed on the semiconductor wafer W and have electrodes formed on both sides thereof, i.e., formed on both sides of the wafer W. Typically, the semiconductor wafer W may be a SiC wafer or a Si wafer, though the kind of the semiconductor wafer W may not be particularly limited.

The probe apparatus includes, within a probe chamber 10 provided in the vicinity of a tester body (not shown) and formed of a cylindrical body (not shown), a mounting table (chuck top) 12 placed on a moving stage 14; and a probe card 16 provided above the mounting table 12 and horizontally supported (fastened) by a probe card holder 18. A test head 20 of the tester is configured to dock on the probe card 16 and the probe card holder 18 in a detachable manner.

To elaborate, the mounting table 12 includes a mounting surface on which the semiconductor wafer W as the inspection target object is horizontally mounted. The mounting surface is made of a plate-shaped or film-shaped conductor having high conductivity, i.e., a mounting surface conductor 22. If the semiconductor wafer W is mounted on the mounting surface conductor 22, electrodes (drain electrodes) exposed on a rear surface of the semiconductor wafer W at a chip unit are brought into direct contact with and electrically connected with the mounting surface conductor 22.

The mounting table 12 is connected to a vacuum device (not shown) configured to attract and hold the semiconductor wafer W on the mounting surface conductor 22. The mounting surface conductor 22 has a multiple number of holes or grooves for vacuum attraction. Further, the mounting surface conductor 22 is also provided with holes through which a multiplicity of lift pins (not shown) are moved up and down to load or unload the semiconductor wafer W on the mounting table 12.

The moving stage 14 is configured to move the mounting table 12 in a horizontal (XY) direction, a vertical (Z) direction and a rotating (θ) direction. Further, the moving stage 14 is also configured to fix (stopping) the mounting table 12 at a certain position within a moving range.

The probe card 16 is manufactured as one kind of printed circuit board, and includes one or more probe needles 24G and 24S to be brought into contact with electrodes (gate electrodes, source electrodes) exposed on a front surface of the semiconductor wafer W at a chip unit individually or in common. To be more specifically, base ends or base portions of the probe needles 24G and 24S are bonded to lower ends of corresponding connection conductors 26G and 26S of the probe card 16, respectively. Further, middle portions of the probe needles 24G and 24S are supported by an insulating supporting member 28 protruded from a bottom surface of the probe card 16, and leading ends (free ends) of the probe needles 24G and 24S are brought into contact with the corresponding electrodes (gate electrodes, source electrodes) exposed on the front surface of the semiconductor wafer W.

The connection conductors 26G and 26S are vertically inserted into through holes 30G and 30S of the probe card 16, and exposed or protruded above and below the probe card 16, respectively. As shown in the drawing, in a docking state, upper ends or top surfaces of the connection conductors 26G and 26S are brought into direct electric contact with corresponding terminals 32G and 32S of the test head 20, respectively. Here, in order to achieve stable electric connection between the test head 20 and the probe card 16 in the docking state, it may be possible, for example, to provide springs (not shown) on the side of the terminals 32G and 32S of the test head 20.

The probe card holder 18 is a strong metal plate and forms a top surface of the probe chamber 10. The probe card holder 18 is horizontally extended around the probe card 16 to surround the probe card 16. The probe card 16 is detachably or replaceably fastened in an opening formed in a central portion of the probe card holder 18.

The probe card holder 18 is configured to support a conductive contact plate 34 while spaced apart from a bottom surface of the probe card holder 18. In this example embodiment, the contact plate 34 is a single body having, at a central portion thereof, an opening 25 surrounding the probe needles 24G and 24S of the probe card 16. The contact plate 34 is horizontally placed between the probe card holder 18 and the mounting table 12. Insulating bolts 36 are inserted into through holes of the probe card holder 18 from above. By screwing leading ends of the bolts 36 into screw holes of the contact plate 34, the contact plate 34 is horizontally held.

A pair of plate top surface terminals 38 is provided at left and right (point-symmetric) positions on the top surface of the contact plate 34. Each plate top surface terminal 38 is electrically connected to a lower end of a rod-shaped (or block-shaped) connection conductor 40, which is vertically extended directly above the plate top surface terminal 38, in direct contact or by soldering. The connection conductor 40 is inserted into a through hole 42 of the probe card holder 18, and exposed or protruded on the probe card holder 18. As depicted in FIG. 1, in the docking state with the test head 20, an upper end or a top surface of the connection conductor 40 is electrically connected to a corresponding terminal 32D of the test head 20 in direct contact.

For example, in order to achieve stable electric connection in the docking state, it may be possible to provide a spring (not shown) on the side of the terminal 32D of the test head 20. Further, a conductive sleeve or a packing (not shown) may be inserted into the through hole 42 to allow the connection conductor 40 to be supported by the probe card holder 18. Further, the pair of left and right terminals 32D of the test head 20 corresponding to the left and right plate top surface terminals 38 of the contact plate 34 are electrically connected in common in the test head 20.

A pair of contactors 44 capable of being independently brought into contact with a bottom surface of the contact plate 34 is provided at left and right (point-symmetric) positions on a side surface of the mounting table 12. At any position of the mounting table 12 within its moving range, if one of the contactors 44 is moved upward (reciprocating) from an original position to a certain height position, an upper end or a top surface of that contactor 44 may be come into contact with the bottom surface of the facing contact plate 34.

In this example embodiment, each contactor 44 is implemented by, but not limited to, a probe pin. Further, there is provided an elevating device 45 capable of controlling a vertical movement and a vertical position of the contactor 44 independently from the moving stage 14. Further, it may be possible to provide a spring (not shown) at the contactor 44 in order to achieve stable electric connection between the contactor 44 and the contact plate 34. Each contactor 44 is electrically connected to the mounting surface conductor 22 via a flexible connection conductor, e.g., a hard wire 46, which is extended outward from a peripheral edge of the mounting table 12.

A dynamic characteristic of each chip (power device) on the semiconductor wafer W is inspected in this probe apparatus as follows. The test head 20 of the tester is in a docking state as depicted in FIG. 1, the semiconductor wafer W is downwardly spaced apart from the leading ends of the probe needles 24G and 24S, and the contactors 44 are also downwardly spaced apart from the contact plate 34. In this state, alignment of an inspection target chip (power device) on the semiconductor wafer W to the probe card 16 or the probe needles 24G and 24S is performed. For the alignment, by moving the mounting table 12 on the moving stage 14 in the horizontal (XY) direction, the electrodes (the gate electrode and the source electrode) on the front surface of the inspection target chip are located directly under the leading ends of the corresponding probe needles 24G and 24S.

Subsequently, the mounting table 12 is moved vertically upward by a certain stroke, the electrodes (the gate electrodes and the source electrode) on the front surface of the inspection target chip press against the corresponding probe needles 24G and 24S from below. Accordingly, electric conduction is achieved between the electrodes (the gate electrode and the source electrode) on the front surface of the inspection target chip and the corresponding terminals 32G and 32S of the test head 20 via a first measurement line, which includes the connection conductors 26G and 26S and the probe needles 24G and 24S of the probe card 16.

Meanwhile, by moving upward (reciprocating) either one of the left and right contactors 44, the upper end or the top surface of that contactor 44 is bought into contact with the bottom surface of the contact plate 34. Accordingly, electric conduction is achieved between an electrode (drain electrode) on a rear surface of the inspection target chip and the corresponding terminal 32D of the test head 20 via a second measurement line, which includes the mounting surface conductor 22 of the mounting table 12, one of the hard wire 46, the corresponding one contactor 44, the contact plate 34 and the corresponding one connection conductor 40.

As stated above, the electric conduction is achieved between the respective electrodes (the gate electrode, the source electrode and the drain electrode) of the inspection target chip, i.e., the power device on the semiconductor wafer W and the corresponding terminals 32G, 32S and 32D of the test head 20. In this state, if a preset voltage is applied between the source electrode and the drain electrode of the power device from the tester through the first measurement line and the second measurement line and a preset control pulse is applied to the gate electrode, a pulse of a current is outputted from the power device, and the pulse of the current is sent to the tester through the first measurement line and the second measurement line. The tester evaluates a dynamic characteristic by measuring, for example, a turn-on or turn-off time or a starting or ending time through signal processing based on the pulse introduced through the terminal 32D of the test head 20, and then determines the faults of the power device.

In this probe apparatus, besides the above-described inspection of the dynamic characteristic, inspection of a static characteristic such as a breakdown voltage test can be performed in the same way as described above excepting that a voltage or a control signal applied from the tester is different.

FIG. 3A to FIG. 3E show positional relationship between the contact plate 34 and the contactor 44 when the mounting table 12 and the contactor 44 are located at a central reference position within a moving range and when the mounting table 12 and the contactor 44 are maximally shifted in any one direction in case of performing the above-described inspection of electrical characteristics on all chips on the semiconductor wafer W. In the shown example, three contactors 44 are provided in parallel in order to increase a current capacity.

Figure 3A:
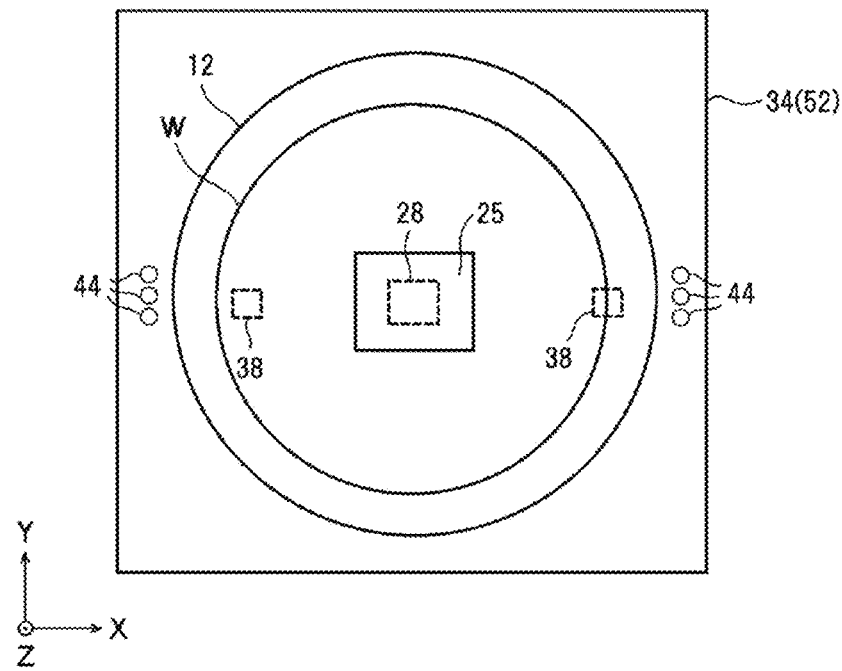
FIG. 3A is a substantially plane view illustrating a positional relationship between a contact plate and a contactor when a mounting table and the contactor are located at a central reference position.

FIG. 3A illustrates a case where the mounting table 12 is located at a central position or a reference position (0, 0) in the XY direction in order to inspect a chip at the center of the semiconductor wafer W. In this case, the left and right contactors 44 are both located under the contact plate 34. At this position, as each contactor 44 is moved upward (reciprocating) from an original position thereof, each contactor may come into contact with the bottom surface of the contact plate 34. Typically, one of the left and right contactors 44 is moved upward (reciprocating) from the original position thereof to be brought into contact with the bottom surface of the contact plate 34, whereas the other contactor 44 is stopped at the original position thereof. Accordingly, the second measurement line may be connected at either one of the left system and the right system.

Figure 3B:
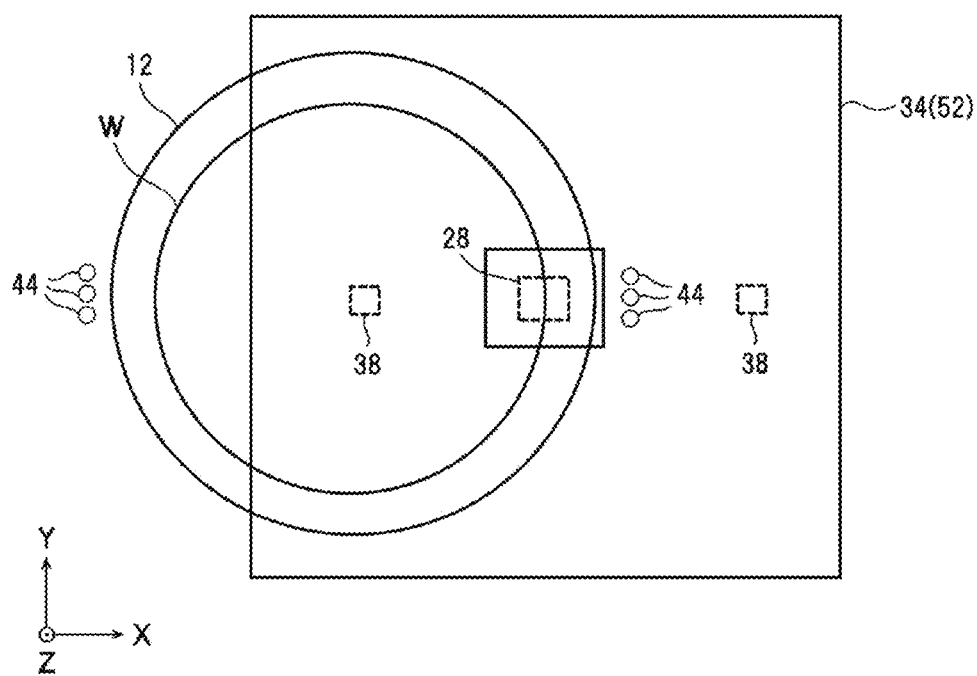
FIG. 3B is a substantially plane view illustrating a positional relationship between the contact plate and the contactor when the mounting table and the contactor are maximally shifted in −X direction.

FIG. 3B illustrates a case where the mounting table 12 is shifted from the central position (0, 0) in the XY direction by about D/2 (D denotes a diameter of the wafer) in a −X direction in order to inspect a chip on a right end of the semiconductor wafer W in the drawing. In this case, since the left contactor 44 is located at the left of (outside) the left end of the contact plate 34, electric contact between the contactor 44 and the contact plate 34 is not made. Since, however, the right contactor 44 is located under the contact plate 34, electric contact therebetween is achieved. Accordingly, the second measurement line is connected at the right system.

Figure 3C:
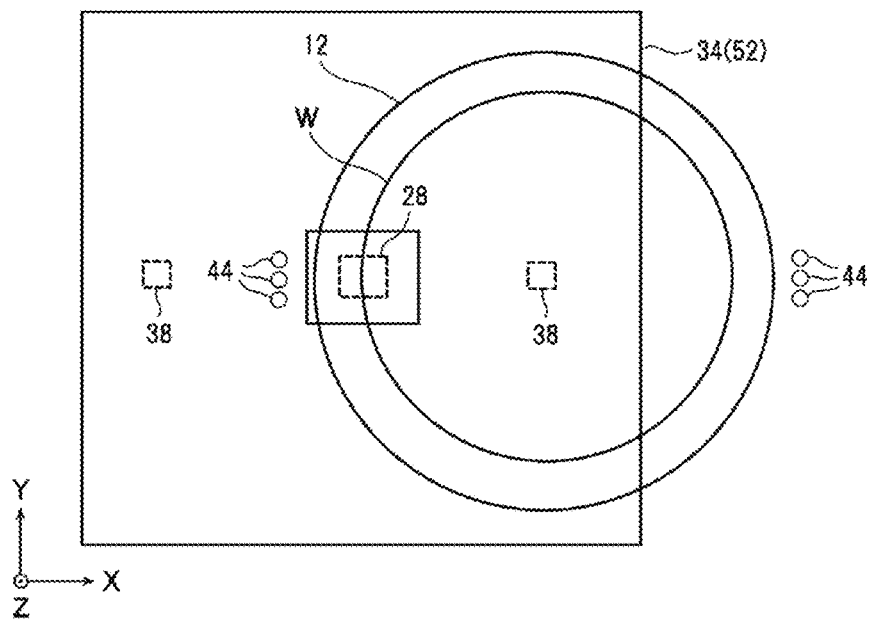
FIG. 3C is a substantially plane view illustrating a positional relationship between the contact plate and the contactor when the mounting table and the contactor are maximally shifted in +X direction.

FIG. 3C illustrates a case where the mounting table 12 is shifted from the central position (0, 0) in the XY direction by about D/2 in a +X direction in order to inspect a chip on a left end of the semiconductor wafer W in the drawing. In this case, reverse to the case of FIG. 3B, the second measurement line is connected at the left system.

Figure 3D:
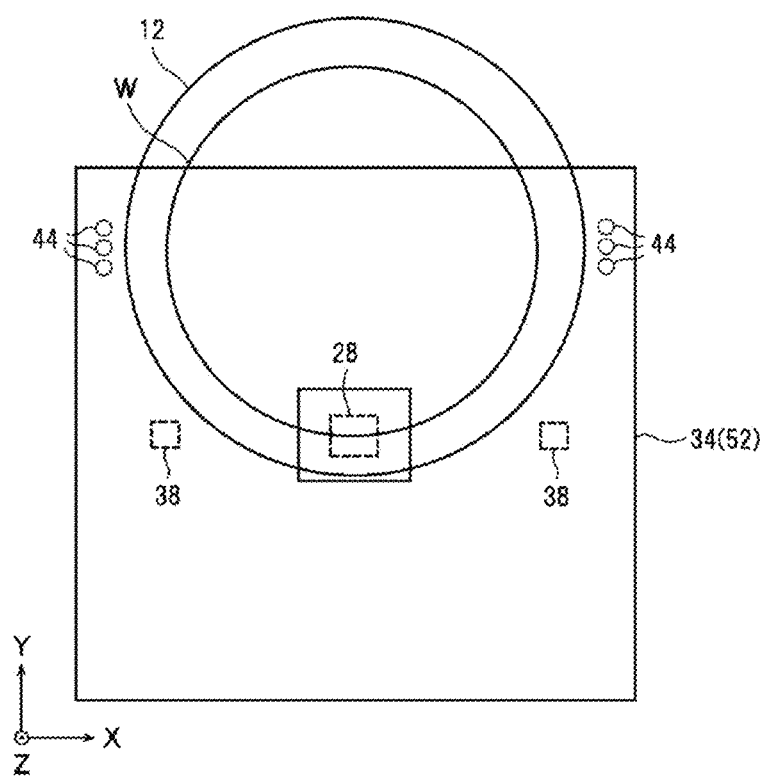
FIG. 3D is a substantially plane view illustrating a positional relationship between the contact plate and the contactor when the mounting table and the contactor are maximally shifted in +Y direction.
Figure 3E:
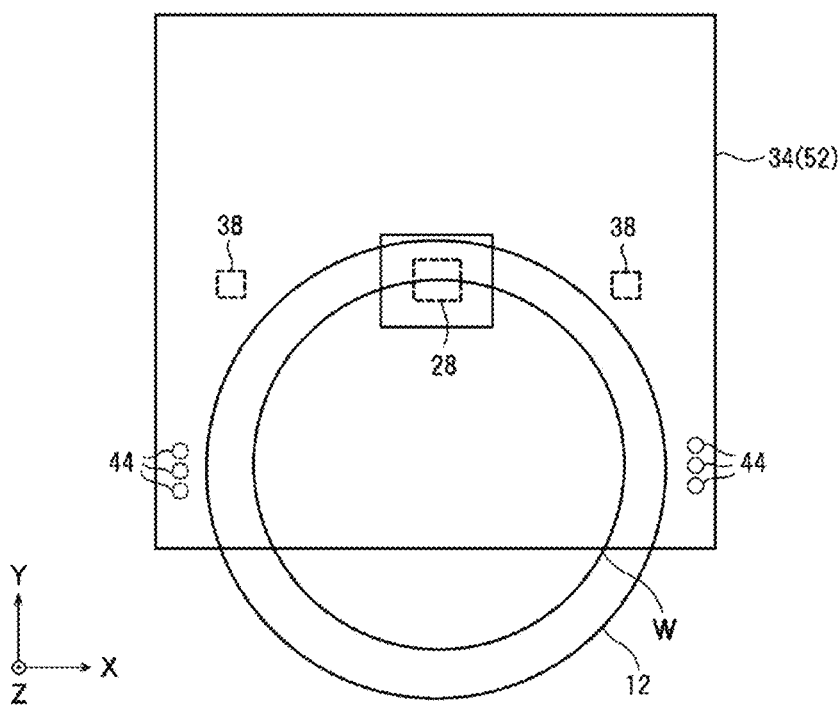
FIG. 3E is a substantially plane view illustrating a positional relationship between the contact plate and the contactor when the mounting table and the contactor are maximally shifted in −Y direction.

FIG. 3D illustrates a case where the mounting table 12 is shifted from the central position (0, 0) in the XY direction by about D/2 in +Y direction in order to inspect a chip on a lower end of the semiconductor wafer W in this drawing. Further, FIG. 3E illustrates a case where the mounting table 12 is shifted from the central position (0, 0) in the XY direction by about D/2 in a −Y direction in order to inspect a chip on a upper end of the semiconductor wafer W in this drawing. In both these cases, the second measurement line is connected at either one of the left system and the right system.

Figure 4:
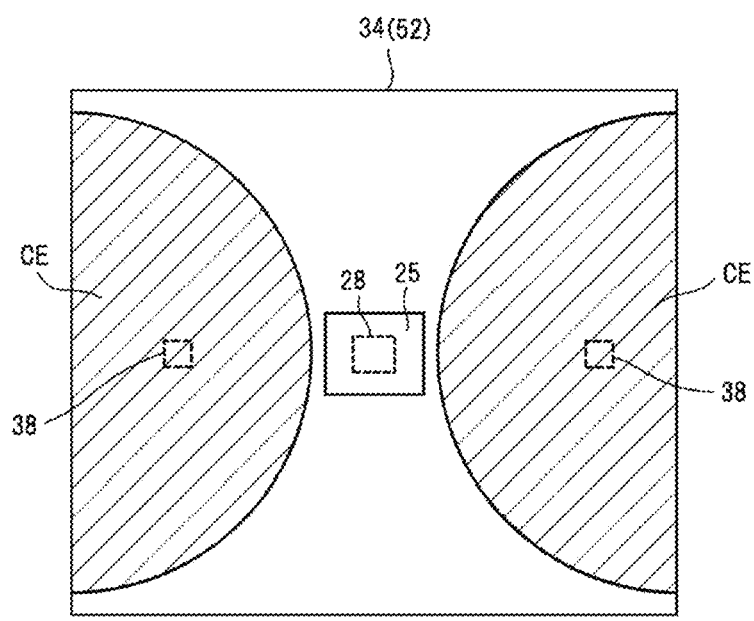
FIG. 4 is a substantially plane view illustrating a region where the contactor comes into contact with the contact plate when inspecting all chips.

FIG. 4 shows regions CE where the left and right contactors 44 come into contact with the contact plate 34 when moving the mounting table 12 in order to inspect all chips. The regions CE are shaded. As shown in the drawing, the regions CE forms semicircular arcs on the left and right sides of the contact plate 34, respectively, with a central portion of the contact plate 34 therebetween. A size or an area of the contact plate 34 is shown in minimum in case that the shape of the plate is a rectangle.

In this probe apparatus, the first measurement line and the second measurement line for making the electric conduction state between each electrode of the inspection target power device and each corresponding terminal of the test head 20 are set to be as short as possible. Especially, in case of the first measurement line, the base ends of the probe needles 24G, 24S and the corresponding terminals 32G, 32S of the test head 20 are arranged to directly face each other in the vertical direction, and thus, are electrically connected at a shortest distance via the connection conductors 26G and 26S of the probe card 16. Further, in case of the second measurement line, the plate top surface terminal 38 of the contact plate 34 and the corresponding terminal 32D of the test head 20 are also arranged to directly face each other in the vertical direction, and thus, are electrically connected at a shortest distance via the rod-shaped (or block-shaped) connection conductor 40 inserted into the through hole 42 of the probe card holder 18 in an electrically non-contact manner. In this way, by minimizing the lengths of the first and second measurement lines, it may be possible to greatly reduce impedance on a pulse current flowing in the first and second measurement lines when inspecting the dynamic characteristics of the power device, as compared to the conventional probe apparatus.

Further, the probe apparatus includes a spark preventing device 50. The spark preventing device 50 is configured to suppress a spark (electric discharge) from occurring near the surface of the semiconductor wafer W by forming an atmosphere of a preset pressure higher than the atmospheric pressure in the vicinity of the probe needles 24G and 24S when the above-described inspection of the electrical characteristics is performed on the inspection target chip (power device) on the semiconductor wafer W.

The spark preventing device 50 is based on a so-called Paschen's law. By way of example, as for a SiC wafer, a chip size of a power device may be, e.g., about several mm×several mm; a minimum distance $d_a$ between the high-voltage probe needle 24S to be brought into contact with the source electrode and the low-voltage probe needle 24G to be brought into contact with the gate electrode may be within, e.g., about several mm; and a minimum distance $d_b$ between the high-voltage probe needle 24S and an electrode on an adjacent chip may be within, e.g., several mm.

According to Paschen's law, if the pressure in the vicinity of the probe needles 24S and 24G is set to p, a voltage (electric discharge starting voltage) $V_a$ ($V_b$) when a spark occurs between two conductors spaced apart from each other at the distance $d_a$ ($d_b$) is defined as $p*d_a$ ($p*d_b$), which is a product of the pressure p and the distance $d_a$ ($d_b$), and there exists a minimum value $V_{am}$ ($V_{bm}$). Typically, the minimum values $V_{am}$ and $V_{bm}$ exist within a depressurized range lower than the atmospheric pressure.

According to Paschen curve, in a pressure range higher than or equal to the atmospheric pressure, as the pressure p in the vicinity of the probe needles 24S and 24G is increased, the electric discharge starting voltage $V_a$ ($V_b$) in the vicinity of the leading end of the high-voltage probe needle 24S or in the vicinity of the surface of the semiconductor wafer W may also be increased. Accordingly, it may be difficult for the spark to occur in the vicinity of the probe needles 24S and 24G or in the vicinity of the semiconductor wafer W.

The spark preventing device 50 mounted in the probe apparatus according to the present example embodiment includes a surrounding member 52 which surrounds the probe needles 24S and 24G between the probe card 16 and the mounting table 12; and a gas supply device 54 configured to supply a gas to the vicinity of the probe needles 24S and 24G through the inside or the vicinity of the surrounding member 52 to form the atmosphere of the preset pressure higher than the atmospheric pressure in the vicinity of the probe needles 24S and 24G when inspecting the electrical characteristics of each chip (power device) on the semiconductor wafer W. In the first example embodiment shown in FIG. 1 and FIG. 2, the contact plate 34 also serves as the surrounding member 52.

(First Example of Spark Preventing Device)

As shown in FIG. 1 and FIG. 2, the contact plate 34 is provided between the probe card holder 18 and the mounting table 12, and has the opening or an inner peripheral wall 25 surrounding the probe needles 24G and 24S of the probe card 16 at a central portion thereof. This contact plate 34 serves as the surrounding member 52 in accordance with the first example. Here, an endless sealing member, e.g., an O-ring 53 is inserted in a gap between the contact plate 34 and the probe card holder 18 (or the probe card 16) to be located closer to a central position than the plate top surface terminals 38. With this configuration, a partitioned space or surrounding space 35 for inspection confined by the probe card 16, the probe card holder 18, the contact plate 34, the semiconductor wafer W and the mounting table 12 is formed in the vicinity of the probe needles 24G and 24S.

The gas supply device 54 includes a gas supply source 56 provided outside the probe chamber 10; gas discharge opening 58 formed in or near an inner peripheral surface 34a of the contact plate 34 facing the probe needles 24G and 24S; and a gas supply line 60 connecting the gas supply source 56 and the gas discharge opening 58; and an opening/closing valve 62 provided at the gas supply line 60.

The gas supply source 56 includes a tank that stores a gas for forming a positive pressure atmosphere in the vicinity of the probe needles 24G and 24S; a compressor or gas supply pump configured to discharge a positive pressure gas from the tank; and a regulator configured to control a pressure of the positive pressure gas discharged from the gas supply pump.

In this example, the gas discharge opening 58 may be plural in numbers at the inner peripheral surface 34a of the contact plate 34 with a uniform density, desirably. The gas supply line 60 includes a relay line 64 connected to a through hole 57 of the probe card holder 18; an external pipeline 66 extended from an outlet of the gas supply source 56 to an inlet (upper end) of the relay line 64; and a plate path 68 extended from an outlet (lower end) of the relay line 64 to the gas discharge openings 58 through the contact plate 34.

In the gas supply device 54, if the opening/closing valve 62 is opened, the positive pressure gas discharged from the gas supply source 56 at the preset pressure is flown through the gas supply line 60, discharged from the gas discharge openings 58 formed in the inner peripheral surface 34a of the contact plate 34 and supplied into the surrounding space 35. A top portion of the surrounding space 35 is completely closed by the probe card 16, the probe card holder 18, the contact plate 34 and the O-ring 53. Meanwhile, a gap g of, e.g., about 0.8 mm is formed between the contact plate 34 and the semiconductor wafer W or the mounting table 12 in a bottom portion of the surrounding space 35. Accordingly, the positive pressure gas supplied into the surrounding space 35 is filled in the surrounding space 35 and leaked to the outside from the gap g at the bottom of the surrounding space 35. Here, by setting the pressure or the flow rate of the positive pressure gas supplied into the surrounding space 35 from the gas supply device 54 to be sufficiently high, it may be possible to form the preset pressure atmosphere higher than the atmospheric pressure in the vicinity of the probe needles 24G and 24S.

As stated above, in the surrounding space 35 accommodating the probe needles 24S and 24G therein, as the pressure p is increased, a spark (electric discharge) starting voltage is also increased in the vicinity of the surface of the semiconductor wafer W (more accurately, in the vicinity of the leading end of the high-voltage probe needle 24S), according to Paschen curve. Accordingly, the pressure p within the surrounding space 35 needs to be adjusted such that a voltage applied to each chip (power device) on the semiconductor wafer W is below the electric discharge starting voltage within the surrounding space 35. As a result, it is possible to suppress a spark from occurring near the probe needles 24S and 24G or near the surface of the semiconductor wafer W. In general, the pressure p within the surrounding space 35 may be adjusted within a pressure range of about 1 atm<p<about 10 atm.

The present inventors conducted a breakdown voltage test for a power device formed on a SiC wafer by using the above-described probe apparatus. When the pressure p within the surrounding space 35 is regulated to, e.g., about 6 atm by using dry air as a positive pressure gas, no spark was observed even at a test voltage of, e.g., about 7000 V.

Figure 5A:
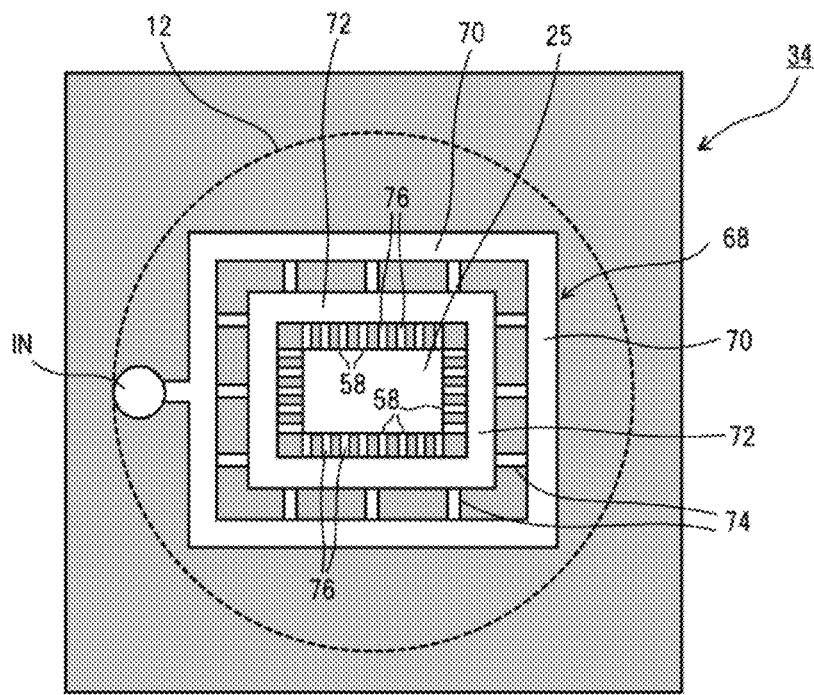
FIG. 5A is a diagram illustrating an example layout of a plate path formed in the contact plate in accordance with the example embodiment.

FIG. 5A illustrates an example layout of the plate path 68 formed in the contact plate 34. As shown in this drawing, the plate path 68 includes a single level or multiple level (two level in the shown example) manifold paths 70 and 72 extended around the opening 25; communication paths 74 extended in a radial shape to connect the outer manifold path 70 and the inner manifold path 72; nozzle paths 76 extended in a radial shape to connect the inner manifold path 72 and the gas discharge openings 58. In this layout of the plate path 68 for a gas flow, it may be possible to discharge the positive pressure gas uniformly from the entire circumference of the opening 25, i.e., from the inner peripheral surfaces 34a along the entire circumference (four sides) of the contact plate 34.

Figure 5B:
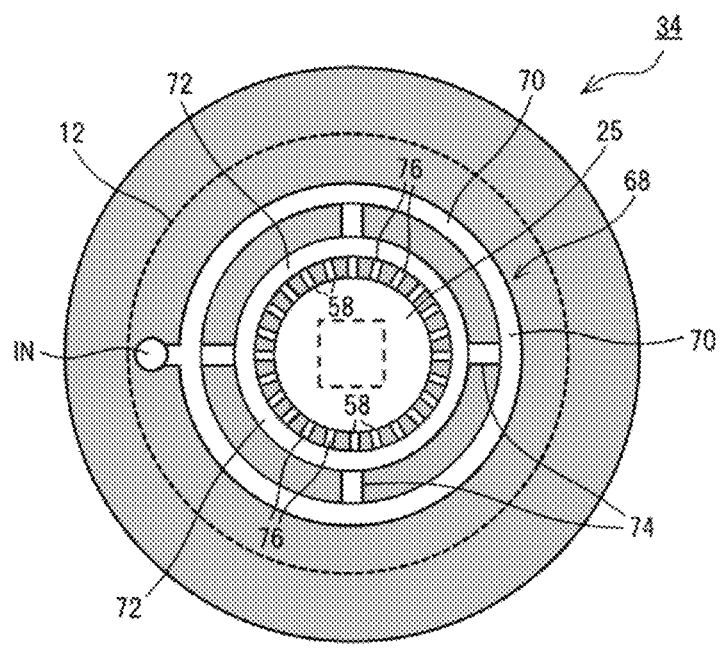
FIG. 5B is a diagram illustrating another example layout of the plate path.
Figure 6:
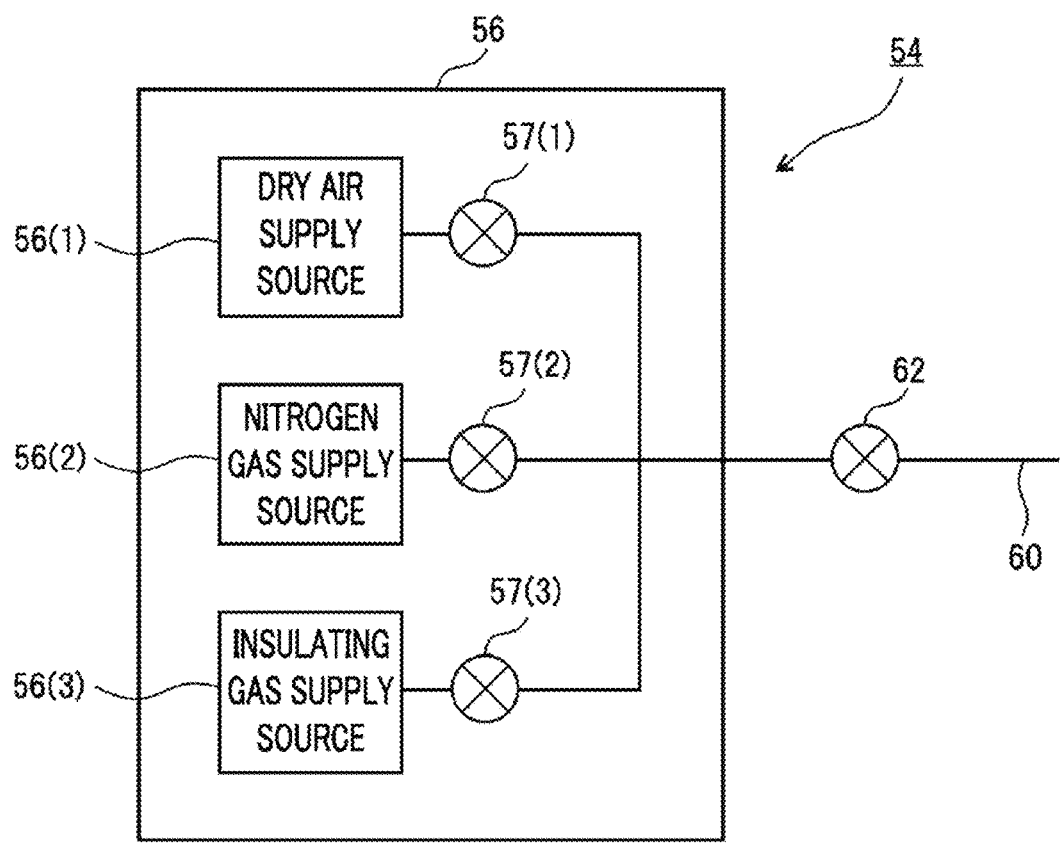

Here, the layout shown in FIG. 5A is nothing more than an example, and various other layouts of the plate path 68 may be adopted. By way of example, as depicted in FIG. 5B, the contact plate 34 and the opening 25 may have circular shapes in a plane view. In this case, the outer and/or the inner manifold path 70 and 72 may be formed in circular ring shapes. Further, as for the gas discharge openings 58, the positive pressure gas may not necessarily be discharged from the entire circumference of the opening 25 but may be discharged from a part of the inner peripheral surfaces 34a of the contact plate 34, for example, from two opposite sides or from a single side thereof.

Further, the contact plate 34 may be made of a conductor having high conductivity and rigidity. The contact plate 34 may not be limited to a single-layered plate, but it may be a multilayered plate such as a laminated metal plate. Further, the shape of the plate path 68 may not be limited to the above-described tunnel shape formed within the contact plate 34, but the plate path 68 may have various shapes, such as a groove shape formed on a surface of the contact plate 34 and equipped with a sealing cover, a pipe shape extended along the surface of the contact plate 34, etc.

Although the gas supply device 54 may have the single gas supply source 56 configured to discharge a single kind of positive pressure gas, it may be desirable that the gas supply device 54 includes multiple kinds of positive gas supply sources, e.g., a dry air supply source 56(1), a nitrogen gas supply source 56(2) and an insulating gas supply source 56(3).

In such a configuration, one of the gas supply sources 56(1), 56(2) and 56(3) may be selectively used by controlling opening/closing valves 57(1), 57(2) and 57(3) of output ports thereof depending on inspection conditions of electrical characteristics performed in the probe apparatus (e.g., the kind of a semiconductor wafer W, the kind of a power device, the kind of the inspection, a test voltage applied to the power device, etc.). By way of example, when the test voltage applied to the power device is not so high, e.g., about 1000 V or less, the dry air supply source 56(1) or the nitrogen gas supply source 56(2) may be used at first. Meanwhile, if the test voltage is considerably high, e.g., about 3000 V or more, the insulating gas supply source 56(3) may be used at first.

The insulating gas supply source 56(3) is configured to discharge a commonly known insulating gas such as, but not limited to, $SF_6$, at a preset pressure. Further, the insulating gas supply source 56(3) may include an insulating liquid vaporizing device configured to vaporize an insulating liquid having a higher voltage resistance, e.g., Fluorinert (registerted trademark, produced by 3M company) by a bubbling method such as a nitrogen bubbling method to generate a nitrogen-mixed insulating gas.

In this example, the gas supply line 60 connecting the gas supply source 56 and the surrounding space 35 passes through the vicinity of the probe card 16, i.e., through the probe card holder 18. Accordingly, the gas supply line 60 may not affect design, manufacture, structure or replacement/installation of the probe card 16 at all.

In this example, the spark preventing device 50 suppresses a spark from occurring on the surface of the semiconductor wafer W based on Paschen's Law by forming the atmosphere of the preset pressure atmosphere higher than the atmospheric pressure in the vicinity of the probe needles 24S and 24G. Thus, unlike in the conventional technique of supplying the insulating liquid on the semiconductor wafer as the inspection target object, the spark preventing device 50 has a simple configuration and can be simply controlled, without increasing the inspection time.

Further, in this example, as a part or a section of the second measurement line for achieving electric conduction between the tester and the electrode on a rear surface of the power device of which electrical characteristics would be inspected on the semiconductor wafer, the contact plate 34 is disposed between the mounting table 12 and the probe card 16 or the probe card holder 18. This contact plate 34 also serves as the surrounding member 52, which forms, as a constituent component of the spark preventing device 50, the surrounding space 35 by surrounding the vicinity of the probe needles 24S and 24G. This configuration may greatly contribute to simplicity and efficiency of the entire probe apparatus as well as those of the spark preventing device 50.

(Second Example of Spark Preventing Device)

Figure 7:
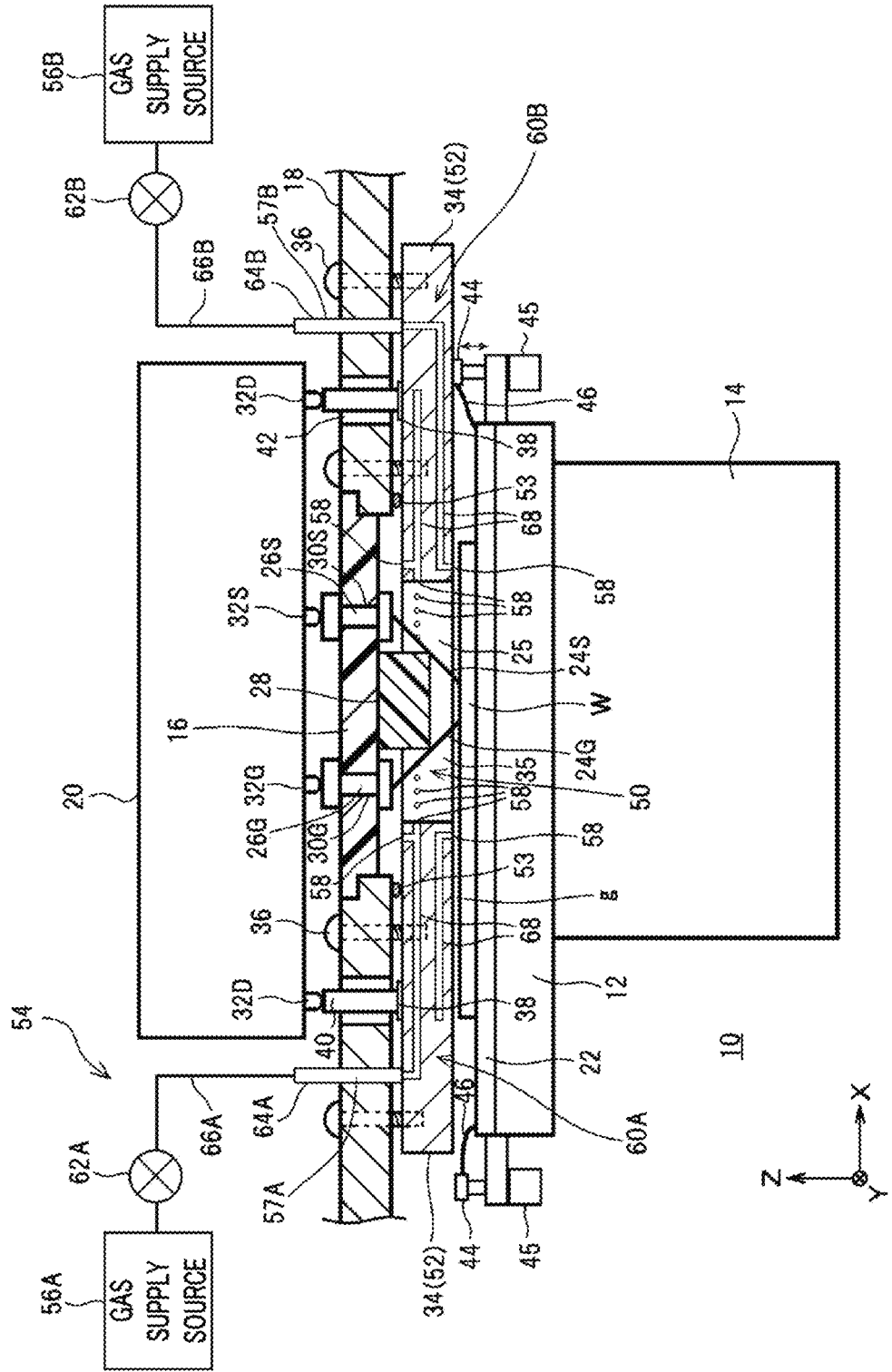
FIG. 7 is a partially cross sectional front view illustrating a configuration of a probe apparatus including a second example of a spark preventing device.

FIG. 7 illustrates a second example of the spark preventing device 50. In the spark preventing device 50 of the second example, the gas supply device 54 of the first example is partially modified. The spark preventing device 50 of the second example has a structure capable of increasing a pressure of a positive pressure atmosphere within the surrounding space 35.

To elaborate, the gas discharge openings 58 for discharging a positive pressure gas into the surrounding space 35 are formed not only in the inner peripheral surfaces 34a of the contact plate 34 but also in a top surface and a bottom surface of the contact plate 34 in the vicinity of the inner peripheral surfaces 34a. With this configuration, a total opening area of the gas discharge openings 58 is increased and, thus, the conductance can be lowered. Further, a dual system of gas supply sources 56A and 56B and gas supply lines 60A and 60B is provided, and a flow rate of the positive pressure gas supplied into the surrounding space 35 can be increased as required.

Further, in this second example, the positive pressure gas is discharged into the gap g between the contact plate 34 and the semiconductor wafer W or the mounting table 12 from the gas discharge openings in the bottom surface of the contact plate 34, so that air curtain may be formed in the gap g. Accordingly, it may be possible to suppress the positive pressure gas filled in the surrounding space 35 from leaking to the outside through the gap g. Thus, a pressure within the surrounding space 35 can be easily adjusted to a required high pressure (e.g., about 6 atm).

Further, the second gas supply source 56B may be omitted, and the first gas supply source 56A may be connected to and shared by the two gas supply lines 60A and 60B.

(Third Example of Spark Preventing Device)

Figure 8:
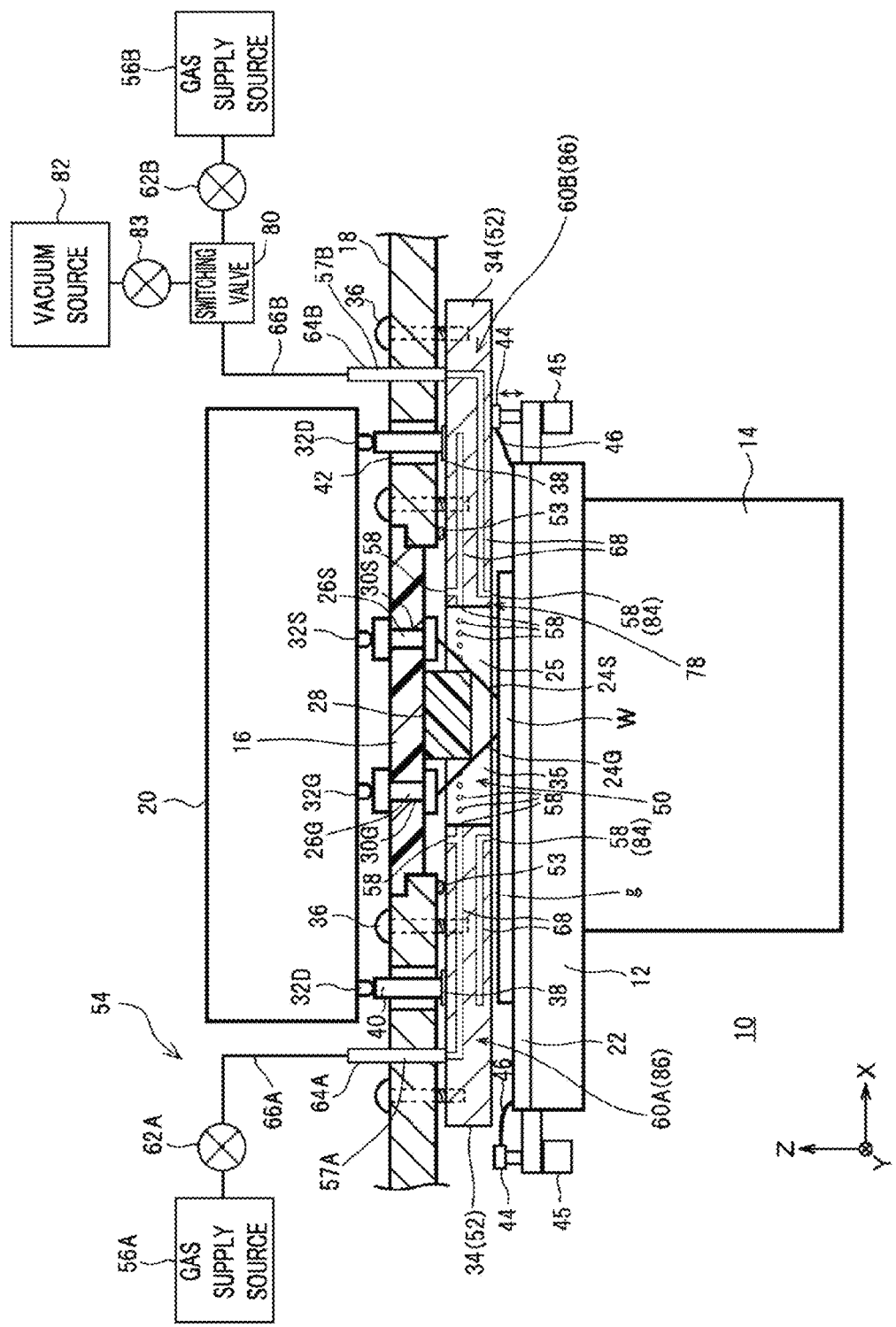
FIG. 8 is a partially cross sectional front view illustrating a configuration of a probe apparatus including a third example of the spark preventing device.

FIG. 8 illustrates a third example of the spark preventing device 50. The spark preventing device 50 of the third example includes, in addition to the configuration of the first example or the second example, a gas collecting device 78 configured to collect, by a vacuum attracting force, the positive pressure gas supplied to the vicinity of the probe needles 24G and 24S (i.e., the surrounding space 35) by the gas supply device 54.

In the shown configuration example, a vacuum source 82 and the second gas supply source 56B are connected to the second gas supply line 60B of the gas supply device 54 in parallel via the switching valve 80. In this configuration, when the vacuum source 82 is connected to the gas supply line 60B via the opening/closing valve 83 and the switching valve 80, the gas discharge openings 58 in the bottom surface of the contact plate 34 may serve as suction openings, and the second gas supply line 60B serves as an exhaust line 86.

In this configuration, the positive pressure gas that is leaked from the surrounding space 35 to the outside via the gap g is suctioned into the suction openings 84, and then, is returned back to the vacuum source 82 via the exhaust line 86 and the switching valve 80.

The gas collecting device 78 in this example may be appropriately used, for example, when it is undesirable that the positive pressure gas (especially, the insulating gas), which is supplied into the surrounding space 35 from the first gas supply source 56A and the gas supply line 60A, is diffused to the vicinity thereof.

Further, the second gas supply source 56B and the switching valve 80 may be omitted, and the vacuum source 82 may be connected to an exclusive exhaust line 86 via the opening/closing valve 83.

(Fourth Example of Spark Preventing Device)

Figure 9:
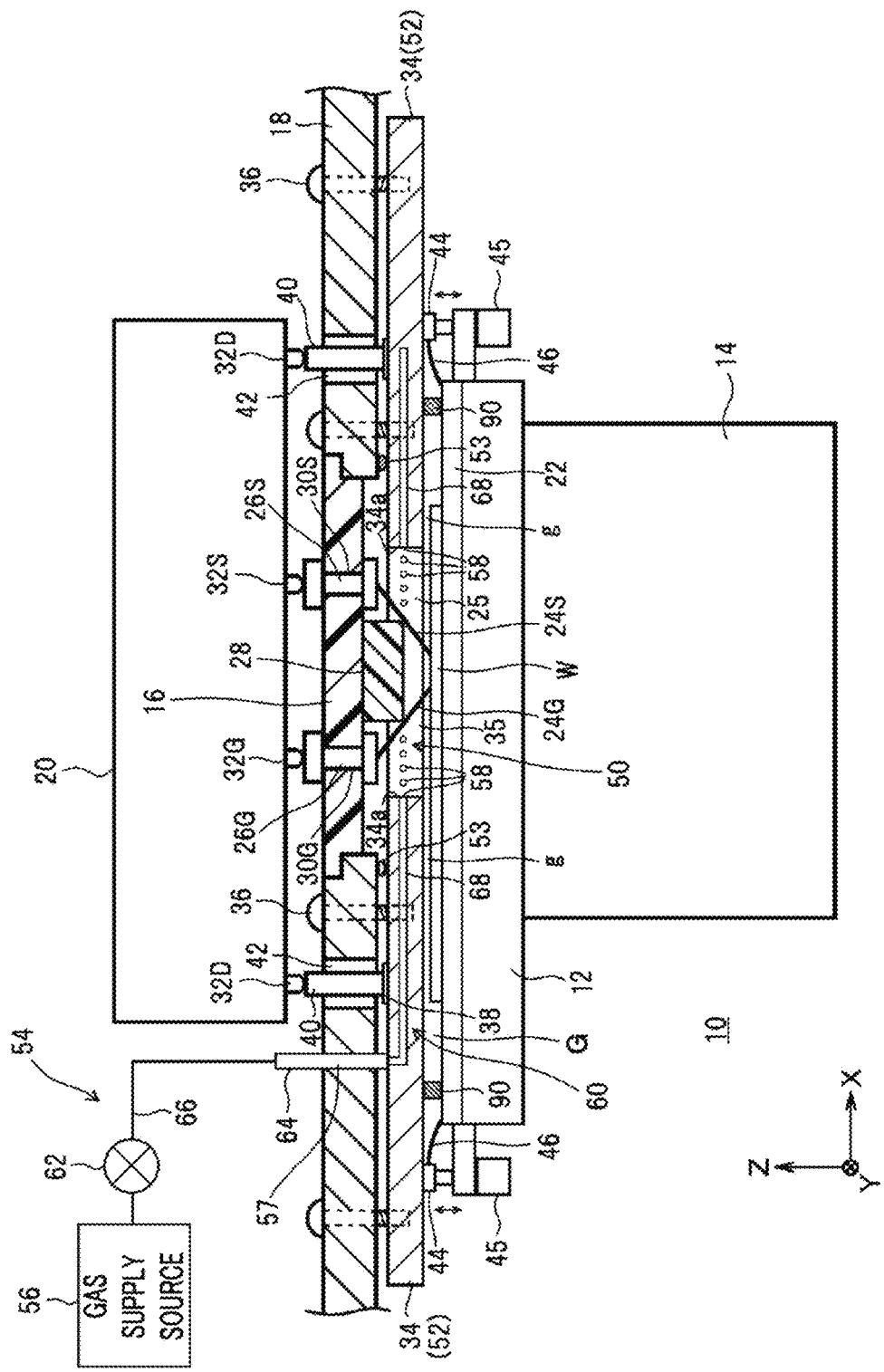
FIG. 9 is a partially cross sectional front view illustrating a configuration of a probe apparatus including a fourth example of the spark preventing device.

FIG. 9 illustrates a modification example of the contact plate 34 and a fourth example of the spark preventing device 50.

In a probe apparatus shown in FIG. 9, the size or the area of a contact plate 34 is increased such that both of the left and right contactors 44 can be brought into contact with a bottom surface of the contact plate 34 by being moved upward to the reciprocating positions wherever the mounting table 12 and the contactors 44 are located within their moving ranges when inspecting all chips (power devices) on the semiconductor wafer W as the inspection target object. That is, the size or the area of the contact plate 34 is increased such that the second measurement lines are connected in parallel at both of the left and right systems.

Further, in this probe apparatus, an annular protrusion 90 made of an insulator such as, but not limited to, a resin is provided to have a preset height (protrusion amount) at a position close to the top surface of the mounting table 12, desirably, at a position close to an edge portion of the top surface of the mounting table 12. The annular protrusion 90 is one of the constituent components of the spark preventing device 50.

Figure 10A:
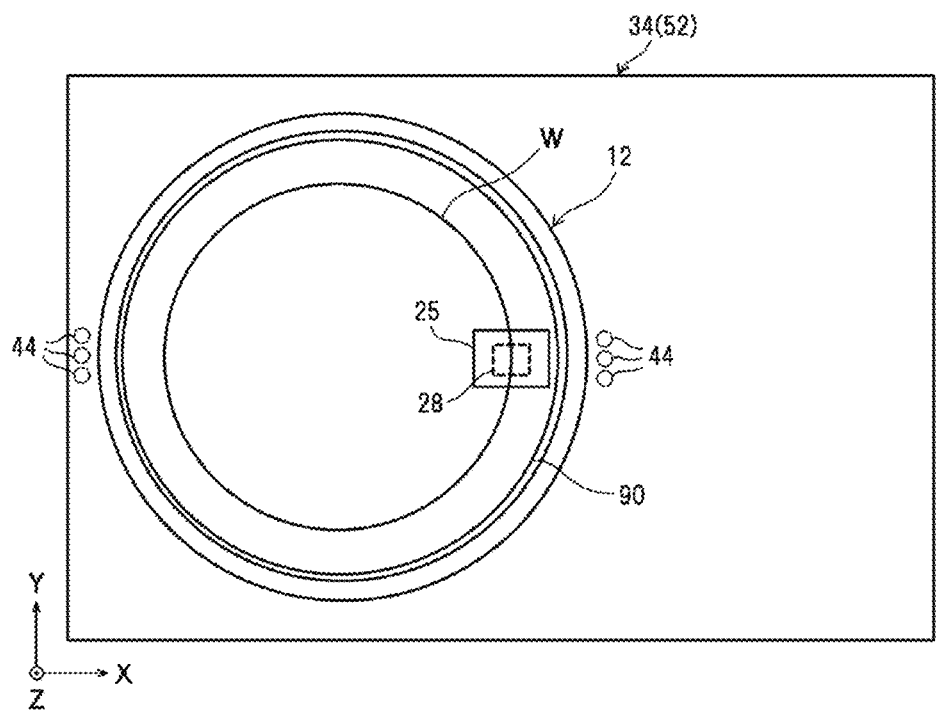
FIG. 10A is a substantially plane view illustrating a positional relationship between an opening of the contact plate and an annular protrusion in accordance with the fourth example thereof.
Figure 10B:
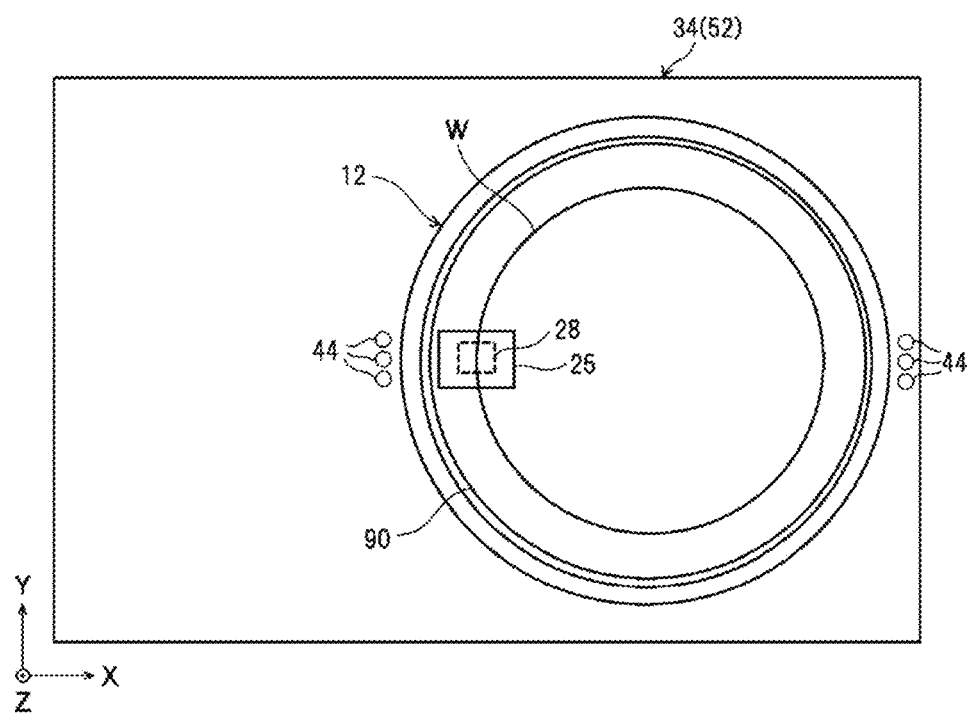
FIG. 10B is a substantially plane view illustrating a positional relationship between the opening of the contact plate and the annular protrusion in accordance with the fourth example thereof.

As shown in FIG. 9, in order to inspect electrical characteristics of a certain chip (power device) on the semiconductor wafer W, when the electrodes (the gate electrode and the source electrode) on the front surface of the inspection target chip are in contact with the leading ends of corresponding probe needles 24G and 24S, respectively, a top portion of the annular protrusion 90 is in contact with or located adjacent to the bottom surface of the contact plate 34. As a result, the gap g between the contact plate 34 and the mounting table 12 is closed to isolate at least an atmosphere therein from the outside. In such a case, as shown in FIG. 10A and FIG. 10B, wherever the mounting table 12 and the contactor 44 are located within their moving ranges, the annular protrusion 90 is allowed to be located outside an opening 25 of the contact plate 34, i.e., outside (around) the surrounding space 35.

In this configuration, since the atmosphere within the surrounding space 35 is isolated from the outside by the annular protrusion 90, it may be possible to increase a pressure of a positive pressure atmosphere within the surrounding space 35 by the gas supplied from the gas supply device 54.

Further, in the fourth example, the gas collecting device 78 in the third example may also be employed. In that configuration, it may be possible to perform a pressure control of increasing or decreasing the pressure within the surrounding space 35 more efficiently at a high speed.

Other Example Embodiments or Modification Examples

Figure 11:
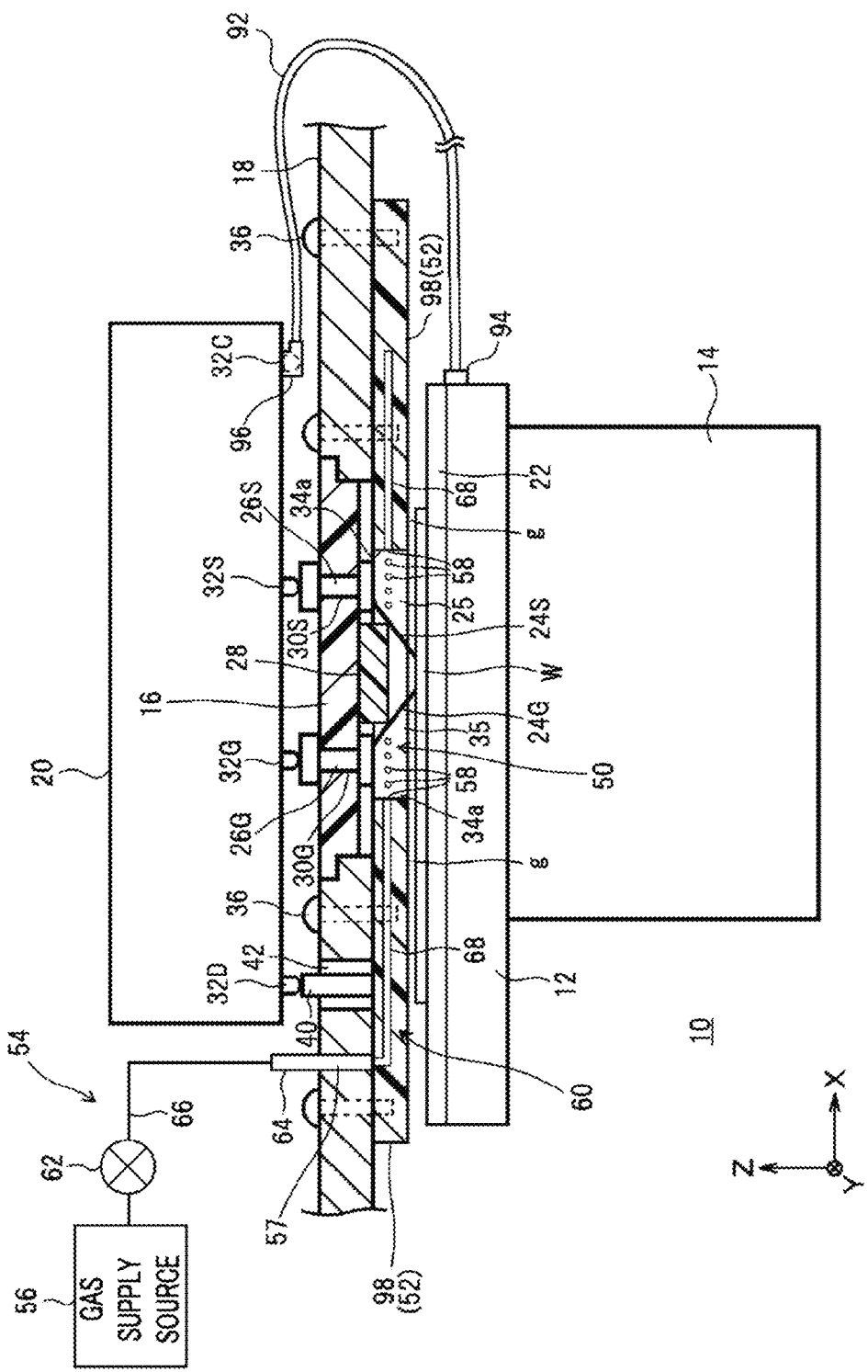
FIG. 11 is a cross sectional view illustrating a configuration of a probe apparatus in accordance with a second example embodiment.

FIG. 11 illustrates a configuration of a probe apparatus in accordance with a second example embodiment. Like the probe apparatus in the above-described first example embodiment, the probe apparatus of the second example embodiment is also configured to inspect electrical characteristics (dynamic characteristics and static characteristics)

of a multiple number of power devices, each of which is formed on a semiconductor wafer W and has electrodes on both sides of a chip, i.e., on both sides of the wafer. The probe apparatus inspects every chip at wafer level.

In this second example embodiment, however, the contact plate 34 (FIG. 1) is not used (accordingly, the contactors 44 and the connection conductor 40 are not used) as a second measurement line for achieving electric conduction between a rear surface electrode of an inspection target power device and a tester. Instead, the probe apparatus of the second example embodiment adopts a configuration in which an electric cable 92 is routed from a mounting surface conductor 22 of a mounting table 12 to a corresponding terminal 32C of a test head 20. Both ends of the electric cable 92 are connected to the mounting surface conductor 22 and the terminal 32C via connectors 94 and 96, respectively.

In this second example embodiment, the contact plate is not used as the second measurement line, but an insulating plate 98 made of, but not limited to, a resin may be used as the surrounding member 52. In this configuration, the insulating plate 98 may be directly fastened to the probe card holder 18, and the O-ring 53 (FIG. 1) may be omitted.

In the probe apparatus of this second example embodiment, a configuration and an operation of a spark preventing device 50 are the same as those of the first to fourth examples thereof. Further, in case of providing an annular protrusion 90 (FIG. 9) in the spark preventing device 50, the annular protrusion 90 may be provided at the insulating plate 98.

Figure 12A:
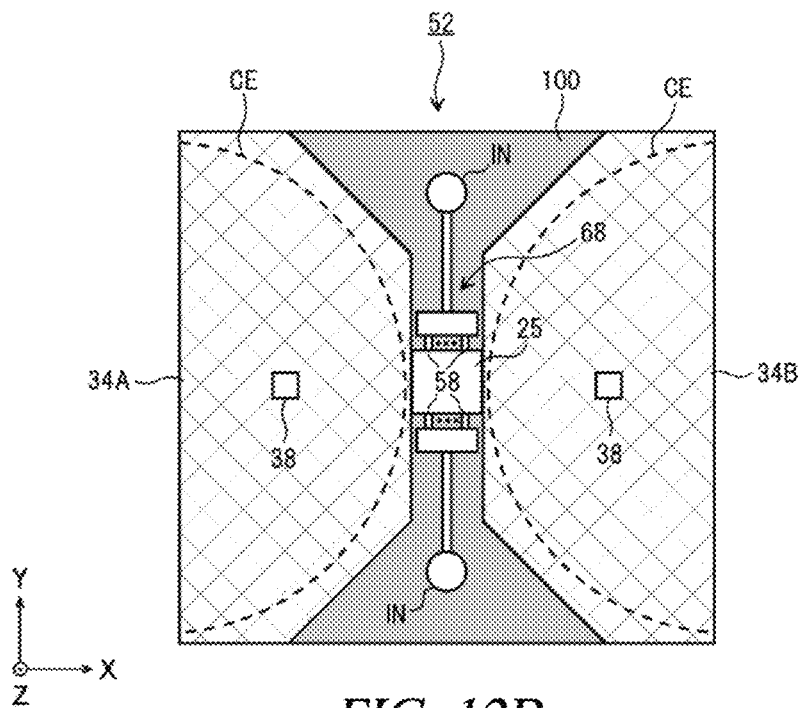
FIG. 12A is a substantially plane view illustrating a modification example of a surrounding member.
Figure 12B:
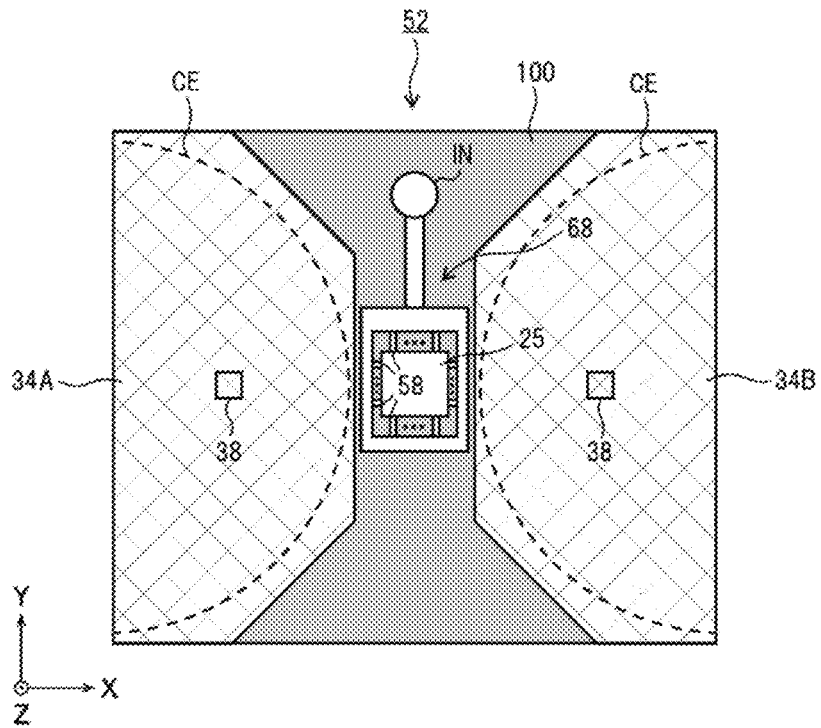
FIG. 12B is a substantially plane view illustrating another modification example of a surrounding member.

Further, as another modification example of the surrounding member 52, the contact plate 34 may be divided (split) into a pair of left and right plates 34A and 34B, and an insulating plate 100 may be provided therebetween, as shown in FIG. 12A and FIG. 12B. In this configuration, a plate path 68 forming a part of the gas supply line 60 may be formed in the separate contact plates 34A and 34B, or may be formed in the insulating plate 100.

Figure 13:
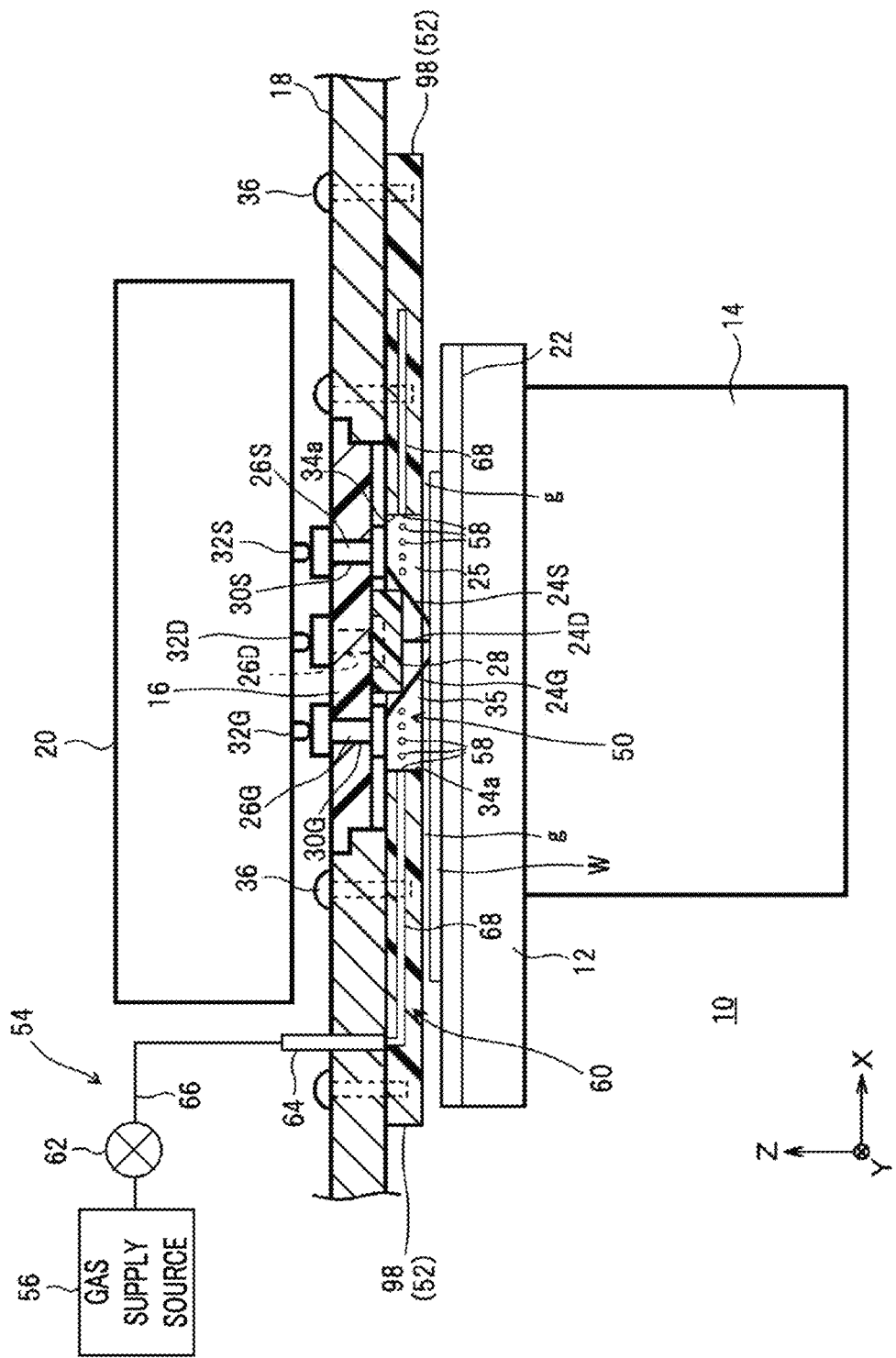
FIG. 13 is a cross sectional view illustrating a configuration of a probe apparatus in accordance with a third example embodiment.

FIG. 13 illustrates a configuration of a probe apparatus in accordance with a third example embodiment. This probe apparatus is configured to inspect electrical characteristics (dynamic characteristics and static characteristics) of a multiple number of power devices, each of which is formed on a semiconductor wafer W, and has electrodes only on a front surface of a chip (without having an electrode on a rear surface of the chip). The probe apparatus is configured to inspect every chip at wafer level.

In this configuration, one or more probe needles 24G, 24S and 24D to be brought into contact with the electrodes (i.e., the gate electrode, the source electrode and the drain electrode) of each chip (power device) exposed on a front surface of the semiconductor wafer W individually or in common are connected to a probe card 16 via connection conductors 26G, 26S and 26D, respectively. As shown in the drawing, in a docking state, upper ends or top surfaces of the connection conductors 26G, 26S and 26D are electrically connected in direct contact with corresponding terminals 32G, 32S and 32D of a test head 20.

During the inspection, a mounting table 12 is moved upward by a certain stroke, and the gate electrode, the source electrode and the drain electrode of the inspection target chip press against leading ends of the corresponding probe needles 24G, 24S and 24D from below. Accordingly, electric conduction is achieved between the gate electrode, the source electrode and the drain electrode of the inspection target chip and the corresponding terminals 32G, 32S and 32D of the test head 20.

In this third example embodiment, as in the second example embodiment, the contact plate 34 is not used as a second measurement line, but an insulating plate 98 made of, but not limited to, a resin may be used as a surrounding member 52. A configuration and an operation of a spark preventing device 50 are the same as those of the first to fourth examples thereof.

Figure 14:
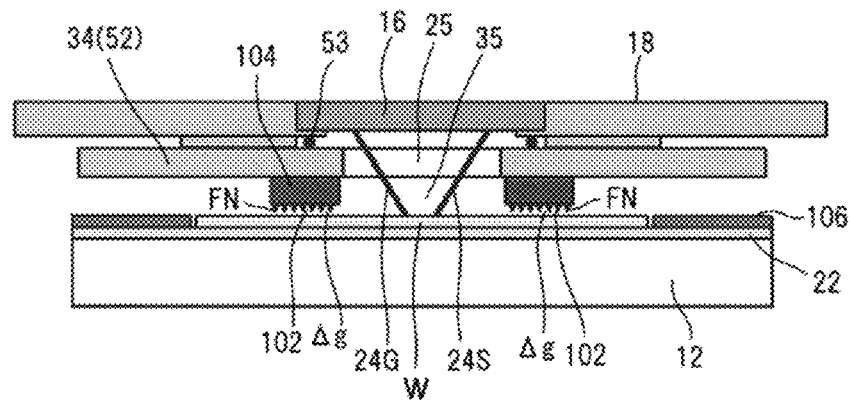
FIG. 14 is a cross sectional view illustrating a configuration of major components of a probe apparatus including the fifth example of a spark preventing device.
Figure 15:
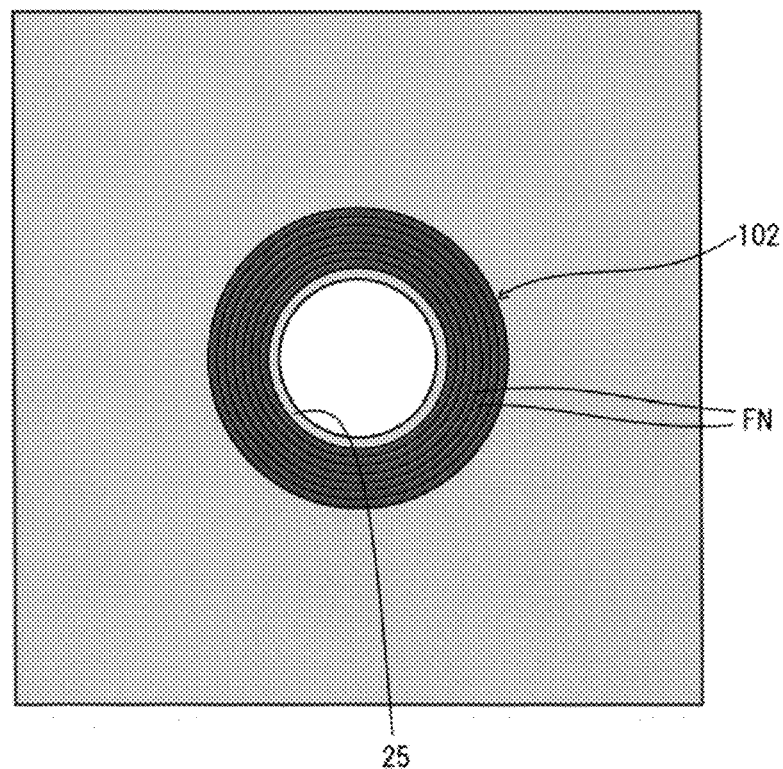
FIG. 15 is a bottom view of a contact plate in the probe apparatus of FIG. 14 seen from below the contact plate.
Figure 16:
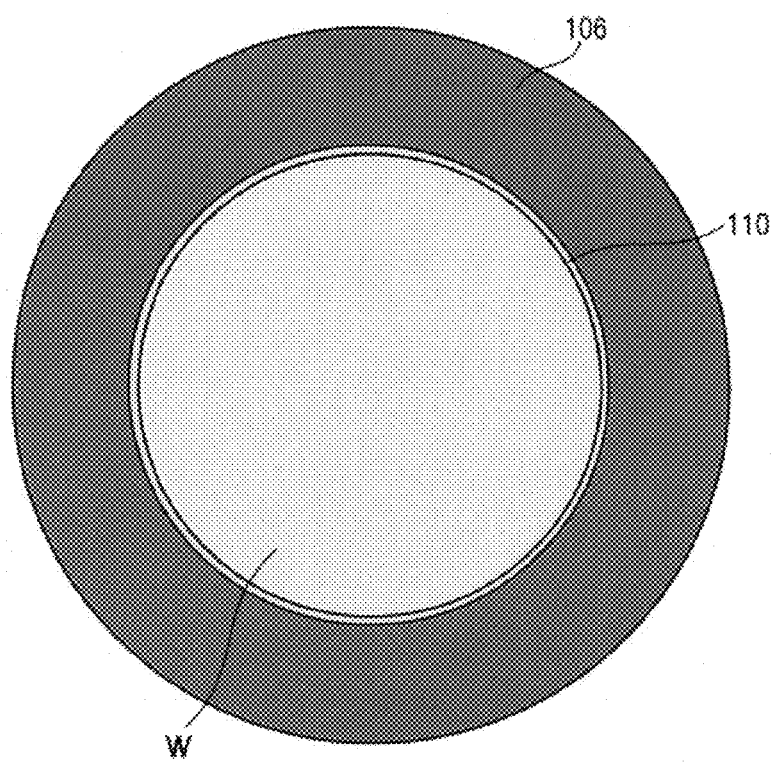
FIG. 16 is a top view of a mounting table and a semiconductor wafer in the probe apparatus of FIG. 14 seen from above.
Figure 17:
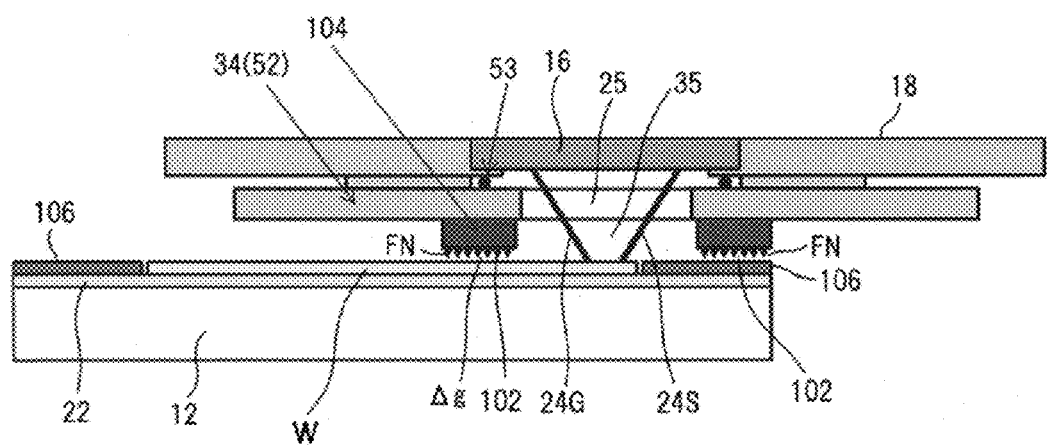
FIG. 17 is a side view for describing an operation of a seal ring in this example.
Figure 18:
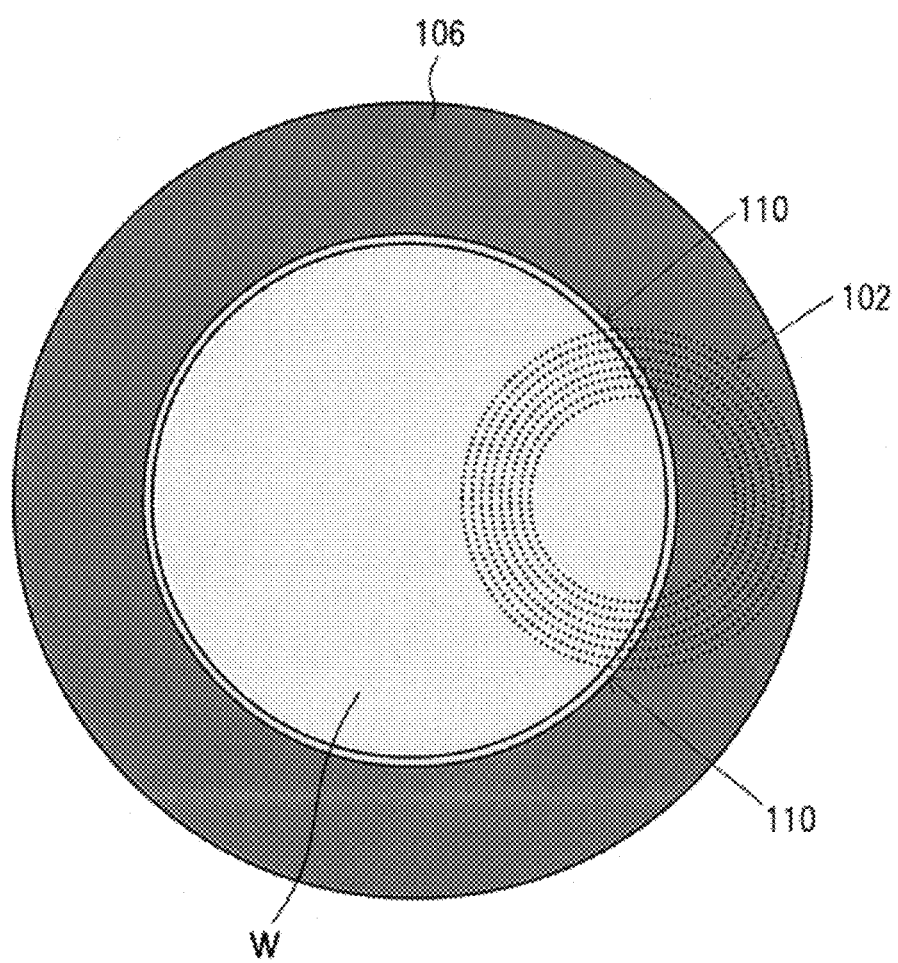
FIG. 18 is a top view for describing the operation of the seal ring in this example.

Now, referring to FIG. 14 to FIG. 18, a fifth example of the spark preventing device 50 will be explained. FIG. 14 illustrates major components of a probe apparatus including the spark preventing device 50 of the fifth example. FIG. 15 is a bottom view illustrating a contact plate 34 in this probe apparatus, seen from below, and FIG. 16 is a top view illustrating a mounting table 12 and a semiconductor wafer in this probe apparatus, seen from above. FIG. 17 and FIG. 18 provide a side view and a top view for describing an operation of a seal ring in this fifth example, respectively.

In the probe apparatus of this fifth example, an annular or an endless labyrinth seal 102 is provided on a bottom surface of the contact plate 34. Desirably, the labyrinth seal 102 may be made of a metal such as SUS, copper or aluminum, or a heat resistant resin such as PEEK. The labyrinth seal 102 has a multiple number of concentric protrusions/recesses or labyrinth fins FN surrounding leading ends of probe needles 24G and 24S.

Desirably, the labyrinth seal 102 is fastened to an innermost bottom surface (a bottom surface most adjacent to an inner peripheral surface 34a) of the contact plate 34 via a partition wall 104. The partition wall 104 is fixed to or formed as one body with the bottom surface of the contact plate 34, and is protruded in a height or thickness of, e.g., several mm. The partition wall 104 is configured to hold the labyrinth seal 102, and also to adjust a gap between the bottom surface of the contact plate 34 and a semiconductor wafer W on the mounting table 12 at a position other than the labyrinth seal 102 is provided. Here, the partition wall 104 may be omitted, and the labyrinth seal 102 may be directly bonded to or formed as one body with the bottom surface of the contact plate 34. A gap $\Delta g$ may be formed between the labyrinth seal 102 and the semiconductor wafer W on the mounting table 12. The labyrinth seal 102 is one of constituent components of the spark preventing device 50.

In this probe apparatus, a positive pressure gas flowing from a surrounding space 35 to the exterior atmospheric space may suffer a great pressure loss due to the multi-level labyrinth fins FN when the positive pressure gas passes through the gap $\Delta g$. That is, a great resistance is applied to the gas flowing from the high-pressure surrounding space 35 to the low-pressure atmospheric space meets through a throttling effect at a leading end of each labyrinth fin FN and a vortex generated between adjacent labyrinth fins FN. Accordingly, the gas leakage may not occur easily. Further, the shape and the number of the shown labyrinth fins FN are nothing more than examples, and the shape and the number of the labyrinth fins may not be particularly limited as long as they have an effect of suppressing the gas leakage.

With this configuration, in case that the gap $\Delta g$ facing the labyrinth seal 102 is set to be of a size equivalent to the gap g between the contact plate 34 and the semiconductor wafer W in the first example (FIG. 1), a flow rate or a leakage amount of the positive pressure gas flowing from the surrounding space 35 to the exterior atmospheric space may be greatly reduced.

Further, if the leakage amount of the positive pressure gas is same, the gap $\Delta g$ in this fifth example can be set to be of a size several times larger than the size of the gap g in the first example (FIG. 1). By way of example, even if the gap Δg is set to be about 0.4 mm, it may be possible to achieve the same gas leakage suppressing effect as obtained in case of setting the gap g to be about 0.1 mm or less in the first example.

In this fifth example, as stated, the gap Δg facing the labyrinth seal 102 need not be narrowed extremely. Thus, it may be possible to appropriately cope with a dimensional tolerance in each component in the vicinity of the surrounding space 35 or non-uniformity in positions of the leading ends of the probe needles.

Further, in this example, an annular or endless seal ring 106 is provided at a periphery portion of a top surface of the mounting table 12 to surround the semiconductor wafer W. The seal ring 106 may be made of, but not limited to, a metal such as SUS, copper or aluminum, or a heat resistant resin such as PEEK. Desirably, the seal ring 106 has a thickness same as that of the semiconductor wafer W on the mounting table 12. The seal ring 106 is also one of constituent components of the spark preventing device 50.

In this probe apparatus, when testing a chip near the edge of the semiconductor wafer W, the mounting table 12 is maximally shifted from the central position (0, 0) of the XY direction by about D/2 (D denotes a wafer diameter) in +X or −X direction, or +Y or −Y direction, as depicted in FIG. 3B to FIG. 3E. In these cases, the surrounding space 35 or the opening 25 of the contact plate 34 may be protruded outward from the edge of the semiconductor wafer W in a radial direction.

In this example, even if the surrounding space 35 or the opening 25 of the contact plate 4 is protruded outward from the edge of the semiconductor wafer W, the labyrinth seal 102 is not protruded to the outside of the seal ring 106. Accordingly, the gas leakage suppressing effect of the labyrinth seal 102 may be fully exerted.

Precisely, as shown in FIG. 18, an annular gap or groove 110 extended in a circumferential direction is formed between an outer peripheral surface of the semiconductor wafer W and an inner peripheral surface of the seal ring 106 on the mounting table 12. Accordingly, the positive pressure gas may be leaked to the exterior atmospheric space through the groove 110, though the gas leakage amount may be small. This gas leakage amount may be very small, as compared to the gas leakage amount when the seal ring 106 is not provided on the mounting table 12.

As discussed above, in this example, by the configuration and the operation of the labyrinth seal 102 and the seal ring 106, it may be possible to reduce a leakage amount of the positive pressure gas supplied into the surrounding space 35 in which the probe needles 24S and 24G are accommodated. Thus, it may be possible to set or adjust a pressure within the surrounding space 35 to a required high pressure.

Furthermore, in this example, by supplying the positive pressure gas into the surrounding space 35 and a sealed space around it, a load applied to each component in the vicinity of the surrounding space 35 may be greatly reduced.

As a comparative example, as in the fourth example (FIG. 9), the annular protrusion 90 surrounding the semiconductor wafer W on the mounting table 12 and capable of being brought into contact with the bottom surface of the contact plate 34 is provided. In this case, if a diameter of the semiconductor wafer W is, e.g., about 5 inches and a supply pressure of the positive pressure gas is, e.g., about 0.6 MPa, a thrust of, e.g., about 760 kg may be generated in an upward direction or a downward direction in the vicinity of the surrounding space 35 (thrust=area×pressure). Here, the downward thrust may be a force pushing the mounting table 12 downward, whereas the upward thrust may be a force lifting up the probe card holder 18 via the contact plate 34 and the probe card 16. For the reason, the probe apparatus needs to have a strong structure capable of enduring the great thrust in the upward and downward directions.

Meanwhile, in the fifth example, since the labyrinth seal 102 is provided on the bottom surface of the contact plate 34, an area of the positive pressure space in the vicinity of the surrounding space 35 which generates a thrust may be defined by a diameter of the labyrinth seal 102, not by the diameter of the semiconductor wafer W. By way of example, when an inner diameter of the labyrinth seal 102 is about 20 mm and an outer diameter thereof is about 40 mm, the diameter of the positive pressure space contributing to the generation of the thrust may be set to be of an average value (about 30 mm) of the inner diameter and the outer diameter. In this configuration, in case that a supply pressure of the positive pressure gas is, e.g., about 0.6 MPa, the thrust in the upward direction and the downward direction may be as small as about 42 kg. Thus, a force applied to the mounting table 12, the contact plate 34, the probe card 16, the probe card holder 18, and the like in the vicinity of the surrounding space 35 may be remarkably reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A probe apparatus of inspecting an electrical characteristic of a semiconductor device formed on a semiconductor wafer, the probe apparatus comprising:
    a movable mounting table configured to mount and support the semiconductor wafer thereon;
    a probe card that is provided above the mounting table to face the mounting table, and is configured to support a probe needle having a leading end to be come into contact with an electrode on the semiconductor wafer supported on the mounting table;
    a surrounding member comprising at least one contact plate that is provided between the probe card and the mounting table and configured to surround the probe needle; and
    a gas supply device configured to supply a gas into a surrounding space confined by the mounting table, the probe card and the surrounding member through an inside or a vicinity of the surrounding member in order to form an atmosphere of a pressure higher than an atmospheric pressure in the vicinity of the probe needle when inspecting the electrical characteristic of the semiconductor device,
    wherein the surrounding member includes gas discharge openings at an inner peripheral surface of the surrounding member, and the gas is discharged from the gas discharge openings and supplied into the surrounding space.

2. The probe apparatus of claim 1,
    wherein the gas supply device comprises a gas supply line passing through a vicinity of the probe card.

3. The probe apparatus of claim 1,
    wherein a labyrinth seal is provided on a bottom surface of the surrounding member.

4. The probe apparatus of claim 3,
wherein the labyrinth seal comprises multiple concentric labyrinth fins surrounding the leading end of the probe needle.

5. The probe apparatus of claim 3,
wherein the labyrinth seal is provided adjacent to the inner peripheral surface of the surrounding member facing the probe needle.

6. The probe apparatus of claim 3,
wherein the labyrinth seal is provided on a bottom surface of a partition wall protruded from the bottom surface of the surrounding member.

7. The probe apparatus of claim 1,
wherein a seal ring surrounding the semiconductor wafer is provided on the mounting table.

8. The probe apparatus of claim 7,
wherein the seal ring has a thickness same as that of the semiconductor wafer on the mounting table.

9. The probe apparatus of claim 1,
wherein a protrusion configured to surround the probe needle and close a gap between the surrounding member and the mounting table is provided on the surrounding member or the mounting table.

10. The probe apparatus of claim 1, further comprising:
a gas collecting unit configured to collect the gas, which is supplied into the surrounding space by the gas supply device, by a vacuum attracting force.

11. The probe apparatus of claim 1,
wherein the gas supply device comprises multiple gas supply sources configured to discharge plural kinds of gases individually, and one of the gas supply sources is selectively used, and
at least one of the gas supply sources comprises an insulating liquid vaporizing device configured to generate an insulating gas by vaporizing an insulating liquid having high voltage resistance.

12. A probe apparatus of inspecting an electrical characteristic of a power device that is formed on a semiconductor wafer and has electrodes on front and rear surfaces thereof, the probe apparatus comprising:
a movable mounting table configured to mount and support the semiconductor wafer thereon;
a probe card that is provided above the mounting table to face the mounting table, and is configured to support a probe needle having a leading end to be come into contact with the electrode on the front surface of the power device, the electrode on the front surface of the power device being exposed at a front surface of the semiconductor wafer supported on the mounting table;
a first connection conductor configured to connect the probe needle and a corresponding first terminal of a tester;
a mounting surface conductor that serves as a mounting surface of the mounting table and is configured to be in contact with the electrode on the rear surface of the power device, the electrode on the rear surface of the power device being exposed at a rear surface of the semiconductor wafer supported on the mounting table;
a contactor that is provided at the mounting table and is configured to be vertically moved and electrically connected with the mounting surface conductor;
a contact plate, having a conductivity, provided between the mounting table and the probe card to come into contact with the contactor at a bottom surface thereof and configured to surround the probe needle;
a second connection conductor configured to connect the contact plate and a corresponding second terminal of the tester; and
a gas supply device configured to supply a gas into a surrounding space confined by the mounting table, the probe card and the contact plate through an inside or a vicinity of the contact plate in order to form an atmosphere of a pressure higher than an atmospheric pressure in the vicinity of the probe needle when inspecting the electrical characteristic of the power device,
wherein the contact plate includes gas discharge openings at an inner peripheral surface of the contact plate, and the gas is discharged from the gas discharge openings and supplied into the surrounding space.

13. The probe apparatus of claim 12,
wherein the gas supply device comprises a gas supply line passing through a vicinity of the probe card.

14. The probe apparatus of claim 13,
wherein the gas supply line is extended through a probe card holder configured to detachably support the probe card in the vicinity of the probe card.

15. The probe apparatus of claim 14,
wherein a plate top surface terminal is provided on a top surface of the contact plate and connected to the second connection conductor,
the plate top surface terminal and the second terminal of the tester face each other in a vertical direction, and
the second connection conductor is straightly extended through the probe card holder in the vertical direction.

16. The probe apparatus of claim 15,
wherein an upper end of the second connection conductor is brought into direct contact with the second terminal of the tester in a detachable manner.

17. The probe apparatus of claim 12,
wherein a base end of the probe needle and the first terminal of the tester face each other in a vertical direction, and
at least a part of the first connection conductor is straightly extended through the probe card in the vertical direction.

18. The probe apparatus of claim 17,
wherein an upper end of the first connection conductor is brought into direct contact with the first terminal of the tester in a detachable manner.

\* \* \* \* \*

UNITED STATES PATENT AND TRADEMARK OFFICE
CERTIFICATE OF CORRECTION

PATENT NO. : 9,562,942 B2
APPLICATION NO. : 14/328860
DATED : February 7, 2017
INVENTOR(S) : Eiichi Shinohara et al.

It is certified that error appears in the above-identified patent and that said Letters Patent is hereby corrected as shown below:

In the Specification

Column 17, Line 31, replace "4" with -- 34 --.

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*